(12) United States Patent
Choi et al.

(10) Patent No.: US 7,920,220 B2
(45) Date of Patent: Apr. 5, 2011

(54) DISPLAY PIXEL, DISPLAY APPARATUS HAVING AN IMAGE PIXEL AND METHOD OF MANUFACTURING DISPLAY DEVICE

(75) Inventors: Pil-Mo Choi, Seoul (KR); Chung Yi, Yongin-si (KR); Deok-Hoi Kim, Seoul (KR); Kwan-Wook Jung, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 1558 days.

(21) Appl. No.: 10/538,166

(22) PCT Filed: Dec. 6, 2003

(86) PCT No.: PCT/KR03/02677
§ 371 (c)(1),
(2), (4) Date: Jun. 8, 2005

(87) PCT Pub. No.: WO2004/053822
PCT Pub. Date: Jun. 24, 2004

(65) Prior Publication Data
US 2006/0164566 A1    Jul. 27, 2006

(30) Foreign Application Priority Data

Dec. 9, 2002  (KR) .................. 10-2002-0078015
Jan. 21, 2003  (KR) .................. 10-2003-0003890

(51) Int. Cl.
*G02F 1/136* (2006.01)
(52) U.S. Cl. .......................................... 349/43; 349/42
(58) Field of Classification Search .................. None
See application file for complete search history.

(56) References Cited

U.S. PATENT DOCUMENTS

| 5,341,012 | A | 8/1994 | Misawa et al. |
| 5,569,610 | A | 10/1996 | Zhang et al. |
| 5,744,824 | A | 4/1998 | Kousai et al. |
| 6,936,844 | B1* | 8/2005 | Yamazaki et al. .............. 257/59 |
| 2002/0125477 | A1 | 9/2002 | So et al. |
| 2002/0158995 | A1 | 10/2002 | Hwang et al. |

(Continued)

FOREIGN PATENT DOCUMENTS

JP    8-160464    6/1996

(Continued)

OTHER PUBLICATIONS

Patent Abstracts of Japan, Publication No. 8-160464, Jun. 21, 1996.
Patent Abstracts of Japan, Publication No. 11-153812, Jun. 8, 1999.
Korean Patent Abstract, Publication No. 1019990067999, Aug. 25, 1999, 2 pages.

* cited by examiner

*Primary Examiner* — Tina M Wong
(74) *Attorney, Agent, or Firm* — Innovation Counsel LLP

(57) ABSTRACT

In a pixel for displays capable of simplifying manufacturing process, a display apparatus having a simplified pixel structure and a method of manufacturing a cost competitive display device, a display pixel includes a channel layer, first to third signal lines, first and second insulating layers and a pixel electrode. The first signal line is formed on the first insulating layer. The first insulating layer insulates the channel layer from the first signal line. The second insulating layer insulates the first signal line from the second and third signal lines, and includes contact holes. The second and third signal lines are connected to the channel layer through the contact holes. The pixel electrode including indium zinc oxide is formed on the identical layer with the first and second signal lines, and disposed on the second insulating layer. Therefore, manufacturing process is simplified and manufacturing time is reduced.

12 Claims, 29 Drawing Sheets

U.S. PATENT DOCUMENTS

2003/0094614 A1* 5/2003 Yamazaki et al. .............. 257/72
2003/0122196 A1 7/2003 Hwang

FOREIGN PATENT DOCUMENTS

| JP | 11-153812 | 6/1999 |
| KR | 1999-0067999 | 8/1999 |

DISPLAY PIXEL, DISPLAY APPARATUS HAVING AN IMAGE PIXEL AND METHOD OF MANUFACTURING DISPLAY DEVICE

TECHNICAL FIELD

The present disclosure relates to a display pixel, a display apparatus having an image pixel and method of manufacturing display devices. More particularly, the present disclosure relates to simplifying a manufacturing process of display devices, a display apparatus having image pixels and a method of manufacturing display devices.

BACKGROUND

A conventional LCD apparatus includes a plurality of pixel electrodes or a common electrode. The pixel electrodes are generally arranged in a matrix shape and disposed on a first transparent substrate. The common electrode corresponding to the pixel electrodes is disposed on a second transparent substrate.

A reference voltage is supplied to the common electrode. A pixel voltage, in accordance with an image signal, is supplied to the pixel electrodes using thin film transistors (TFTs).

FIG. 1 is a cross-sectional view showing a conventional TFT.

Referring to FIG. 1, the TFT 10 includes a gate electrode 1, a first insulating layer 2, a channel layer 3, a source electrode 4, a second insulating layer 6 and a drain electrode 5 connected to a pixel electrode 8.

The gate electrode 1 is formed on a transparent or a proper substrate 9, such as glass, plastic, silicon wafer, steel or others. A gate line (not shown) applying a driving signal to the gate electrode is connected to the gate electrode.

The first insulating layer 2 is formed over the substrate so as to insulate the gate electrode 1 and a gate line.

The channel layer 3 corresponding to the gate electrode 1 is formed on the first insulating layer 2. The channel layer 3 includes an amorphous silicon channel layer $3a$ and N+ amorphous silicon channel layer $3b$.

The N+ amorphous silicon layer $3b$ has first and second pieces separated from each other, and the second piece is formed on the amorphous silicon layer $3a$.

The source electrode 4 is connected to the first piece of the N+ amorphous silicon channel layer $3b$, and the drain electrode 5 is connected to the second piece of the N+ amorphous silicon channel layer $3b$.

The second insulating layer 6 is formed over the transparent substrate 9, and disposed on the source electrode 4 and the drain electrode 5. The second insulating layer 6 includes a contact hole $6a$ through which the drain electrode 5 is partially exposed.

The pixel electrode 8 is formed on the second insulating layer 6, and connected to the drain electrode 5 through the contact hole $6a$.

The second insulating layer 6 includes the contact hole $6a$ disposed between the drain electrode 5 and the pixel electrode 8. Therefore, more steps of manufacturing the TFT 10 having a complex structure are added.

DISCLOSURE OF THE INVENTION

The present invention provides a display pixel capable of simplifying manufacturing process.

The present invention also provides a method suitable for manufacturing a simplified display pixel.

The present invention also provides a display apparatus having a simplified display image pixel.

The present invention also provides a method suitable for manufacturing the above display apparatus.

Display pixels in accordance with an exemplary embodiment of the present invention include a channel layer, a first signal line, an insulating interlayer, a second signal line, a third signal line and a pixel electrode. The channel layer includes a channel that may be formed by applying a first voltage, and the channel transports an electron. The first signal line supplies the first voltage to the channel layer. The insulating interlayer insulates the first signal line from the channel layer, and includes a first contact hole and a second contact hole through which the channel layer is partially exposed. The second signal line is disposed on the insulating interlayer, and electrically connected to the channel layer through the first contact hole so as to apply a second voltage to the channel layer. The third signal line is disposed on the insulating interlayer, and electrically connected to the channel layer through the second contact hole so as to output the second voltage from the channel layer. The pixel electrode is disposed on the insulating interlayer, and electrically connected to the third signal line.

The method of manufacturing display pixels in accordance with an exemplary embodiment of the present invention is provided as follows. A channel layer is formed on a transparent or a proper substrate, such as glass, plastic, metal, silicon wafer or others, using a first pattern mask. The channel layer has a channel that may be formed by applying a first voltage. A first signal line applying the first voltage to the channel layer is formed using a second pattern mask. A first contact hole and a second contact hole are formed on an insulating interlayer using a third pattern mask. The channel layer is partially exposed through the first and second contact holes, and the insulating interlayer insulates the first signal line from the channel layer. A second signal line electrically connected to the channel layer through the first contact hole and a third signal line electrically connected to the channel layer through the second contact hole are formed on the insulating interlayer using a fourth pattern mask. A pixel electrode electrically connected to the third signal line is formed on the insulating interlayer.

The display apparatus in accordance with another exemplary embodiment of the present invention includes a first substrate, a second substrate and a liquid crystal layer between the first and second substrates.

The first substrate has a first transparent or non transparent substrate, a channel layer, a first signal line, a second signal line, a third signal line, a pixel electrode and an etch stop layer. The channel layer is formed on the first transparent substrate. The first signal line having a first electrode insulated from the channel layer is disposed at a position corresponding to the channel layer. The first signal line is extended in a first direction. The second signal line has a second electrode connected to the channel layer. The second signal line is extended in a second direction. The third signal line having a third electrode connected to the channel is insulated from the second signal line. The pixel electrode is formed over the third signal line so as to transmit light supplied through the first transparent substrate or to reflect light from the substrate. The etch stop layer is disposed over the second signal line so as to prevent the second signal line from being etched while the pixel electrode is patterned.

The second substrate includes a second transparent substrate corresponding to the first transparent substrate, and a common electrode formed on the second transparent substrate. The liquid crystal layer is disposed between the first and second substrates.

The LCD apparatus in accordance with an aspect of the present invention includes a first substrate, a second substrate and a liquid crystal layer between the first and second substrates.

The first substrate includes a first transparent or non-transparent substrate such as glass, metal, reflective metal, silicon wafer or other proper materials, a channel layer, a first signal line, a second electrode, a second signal line and a pixel electrode. The channel layer is formed on the first transparent substrate. The first signal line, having a first electrode insulated from the channel layer, is disposed at a position corresponding to the channel layer. The second electrode is connected to the channel layer. The second signal line is disposed over the second electrode. The pixel electrode connected to the channel layer is insulated from the second electrode.

The second substrate includes a second transparent substrate corresponding to the first transparent substrate and a common electrode formed on the second transparent substrate and corresponding to the pixel electrode. The liquid crystal layer is disposed between the first and second substrates.

The LCD apparatus in accordance with another aspect of the present invention includes a first substrate, a second substrate and a liquid crystal layer between the first and second substrates.

The first substrate includes a first transparent substrate, a channel layer, a first signal line, a second electrode, a second signal line and a pixel electrode. The channel layer is formed on the first transparent substrate. The first signal line having a first electrode insulated from the channel layer is disposed at a position corresponding to the channel layer. The second electrode is connected to the channel layer. The second signal line is disposed over the second electrode. The pixel electrode connected to the channel layer is insulated from the second electrode.

The second substrate includes a second transparent substrate corresponding to the first transparent substrate and a common electrode formed on the second transparent substrate and corresponding to the pixel electrode. The liquid crystal layer is disposed between the first and second substrates.

The LCD apparatus in accordance with still another aspect of the present invention includes a first substrate, a second substrate and a liquid crystal layer between the first and second substrates.

The first substrate includes a first transparent substrate, a channel layer, a first signal line, an insulating interlayer, a pixel electrode, a second signal line, a third electrode and a third signal line. The channel layer is formed on the first transparent substrate. The first signal line having a first electrode insulated from the channel layer is disposed at a position corresponding to the channel layer. The insulating interlayer having a plurality of contact holes insulates the first signal line from the channel layer. The pixel electrode is formed on the insulating interlayer. The second signal line includes a second electrode connected to the channel layer. The third electrode, connected to the channel layer, is insulated from the second signal line. The third signal line disposed on the pixel electrode is electrically connected to the pixel electrode.

The second substrate includes a second transparent substrate corresponding to the first transparent substrate and a common electrode formed on the second transparent substrate and corresponding to the pixel electrode. The liquid crystal layer is disposed between the first and second substrates.

The method of manufacturing the LCD apparatus in accordance with one aspect of the present invention is provided as follows.

A first substrate is formed by forming a channel layer, forming a first signal line, forming a second signal line, forming a third signal line, forming a pixel electrode and an etch stop layer. The channel layer is formed on a first transparent substrate. The first signal line having a first electrode insulated from the channel layer is disposed at a position corresponding to the channel. The second signal line has a second electrode connected to the channel layer. The third signal line having a third electrode insulated from the second signal line is connected to the channel layer. The pixel electrode is formed over the third signal line so as to transmit light from the first transparent. The etch stop layer is disposed over the second signal line so as to prevent the second signal line from being etched during patterning the pixel electrode.

A common electrode is formed on a second transparent substrate corresponding to the first transparent substrate to form a second substrate. Liquid crystal is injected into a space between the pixel electrode of the first substrate and the common electrode of the second substrate.

The method of manufacturing an LCD apparatus in accordance with another aspect of the present invention is provided as follows.

A first substrate is formed by forming a channel layer, forming a first signal line, forming a second electrode and a pixel electrode and forming a second signal line. The channel layer is formed on a first transparent substrate. The first signal line has a first electrode insulated from the channel layer and disposed at a position corresponding to the channel layer. The second electrode is connected to the channel layer. The pixel electrode connected to the channel layer is insulated from the second electrode. The second signal line is formed over the second electrode.

A second substrate is formed by forming a common electrode corresponding to the pixel electrode on a second transparent substrate corresponding to the first transparent substrate. Liquid crystal is injected into a space between the first and second substrates.

The method of manufacturing an LCD apparatus in accordance with still another aspect of the present invention is provided as follows.

A first substrate is formed by forming a channel layer, forming a first signal line, forming an insulating interlayer, forming a pixel electrode and forming a second signal line and a third signal line. The channel layer is formed on a first transparent substrate. The first signal line including a first electrode insulated from the channel layer is disposed at a position corresponding to the channel layer. The insulating interlayer including a plurality of openings insulates the first signal line from the channel layer. The pixel electrode is formed on the insulating interlayer. The second signal line includes a second electrode connected to the channel layer. The third signal line insulated from the second signal line includes a third electrode connected to the channel layer and the pixel electrode.

A second substrate is formed by forming a common electrode corresponding to the pixel electrode on a second transparent substrate corresponding to the first transparent substrate.

Liquid crystal is injected into a space between the first and second substrates.

Therefore, the structure of the display pixel for the LCD apparatus and manufacturing process are simplified to reduce manufacturing cost and time.

BRIEF DESCRIPTION OF THE DRAWINGS

The above and other advantages of the present invention will become readily apparent by reference to the following detailed description when considered in conjunction with the accompanying drawings wherein.

BEST MODE FOR CARRYING OUT THE INVENTION

Display Pixel

Figure 2:
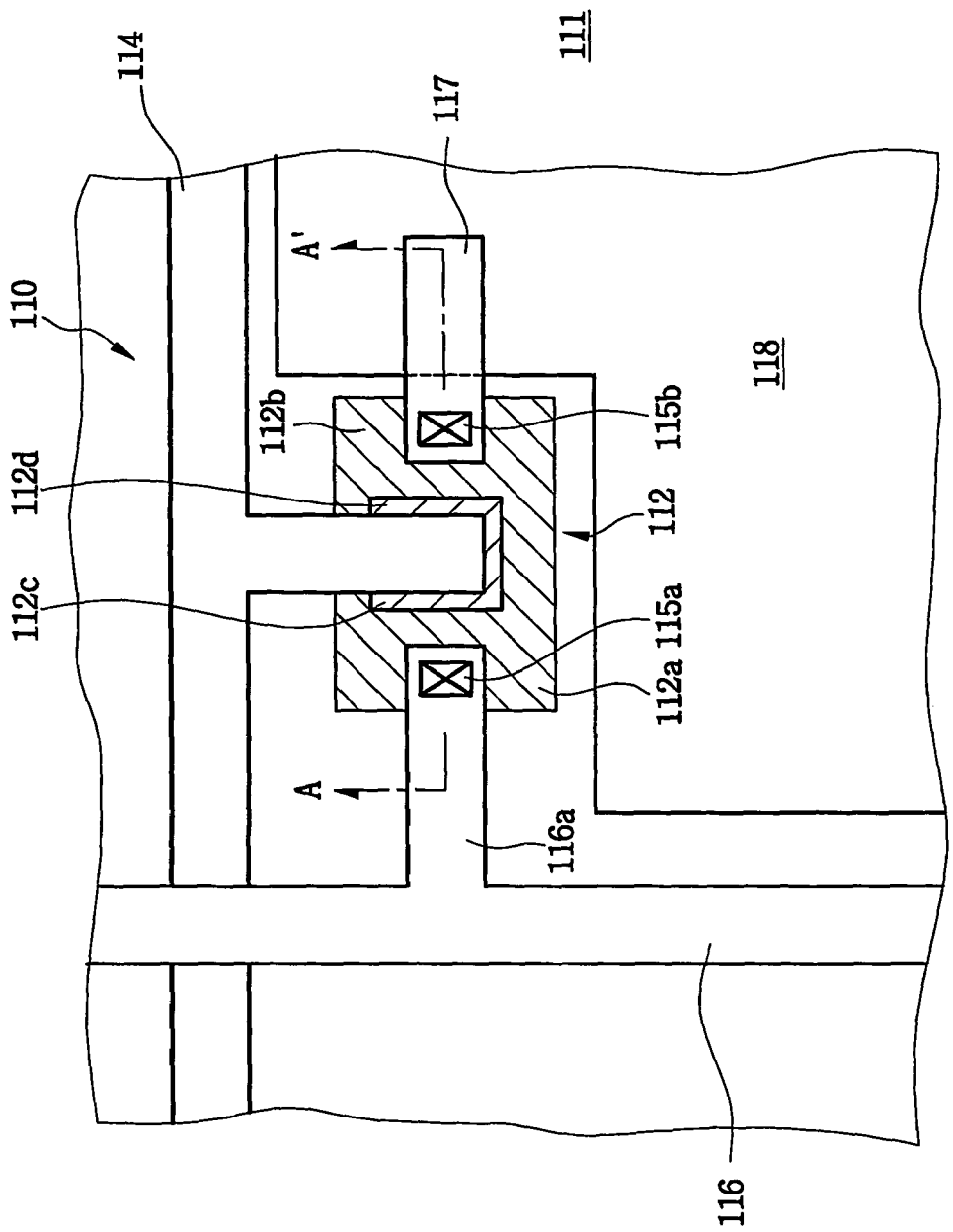
FIG. 2 is a plan view showing a display pixel according to an exemplary embodiment of the present invention.
Figure 3:
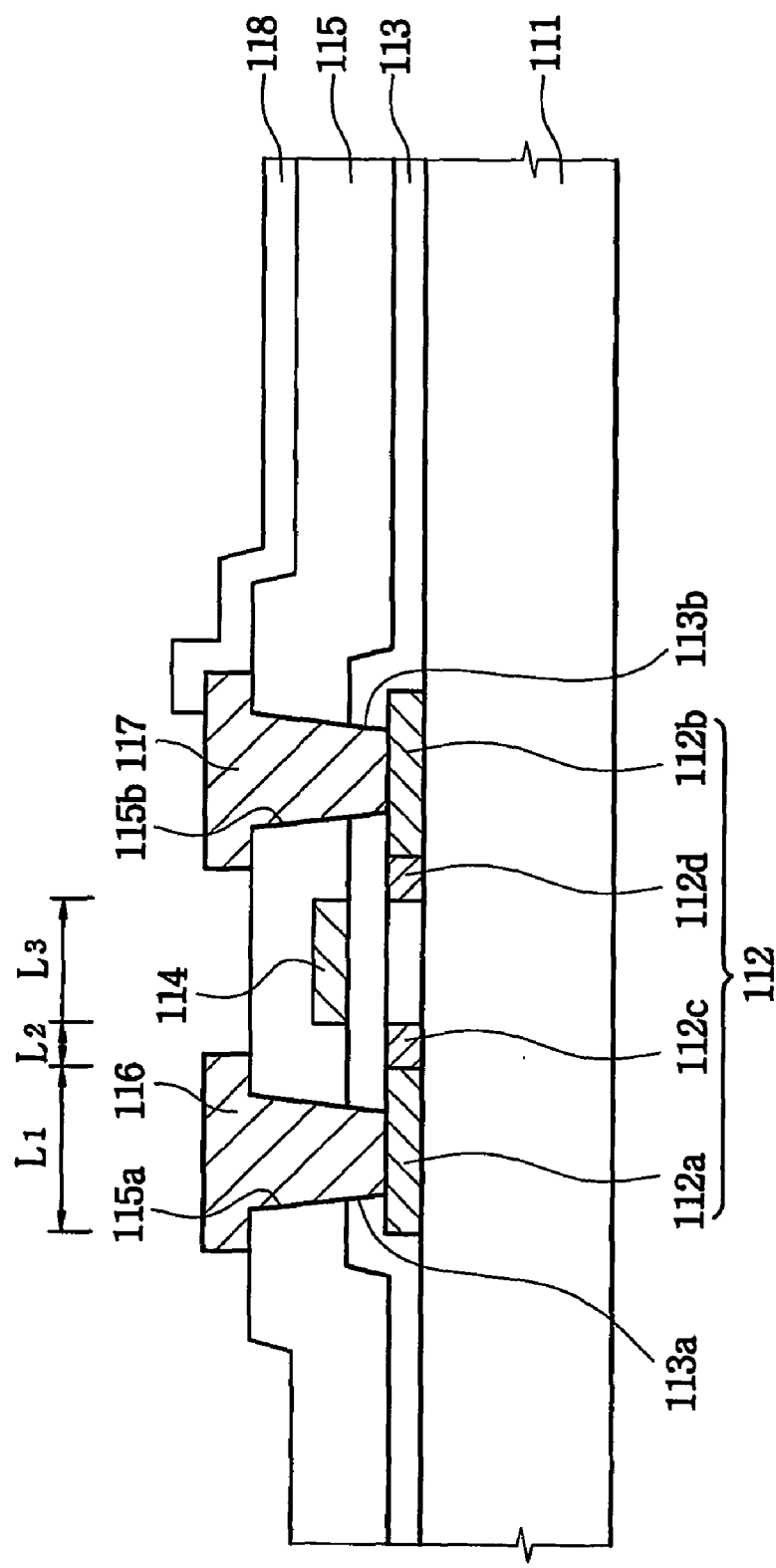
FIG. 3 is a cross-sectional view showing A-A' line of FIG. 2.

FIG. 2 is a plan view showing a display pixel according to an exemplary embodiment of the present invention, and FIG. 3 is a cross-sectional view showing A-A' line of FIG. 2.

Referring to FIGS. 2 and 3, the display pixel 110 includes a first transparent substrate 111, a channel layer 112, a first insulating layer 113, a first signal line 114, a second insulating layer 115, a second signal line 116, a third signal line 117 and a pixel electrode 118.

The first transparent substrate 111 includes a glass substrate having a high light transmittance.

The channel layer 112 is formed on the first transparent substrate 111. The channel layer 112 comprises polysilicon, and includes a thin film of a rectangular shape. A laser beam is irradiated onto the amorphous silicon thin film to form the polysilicon thin film.

The channel layer 112 includes first and second regions 112a and 112b implanted with impurities at a high concentration of a first dose, and third and fourth regions 112c and 112d implanted with impurities at a low concentration of a second dose lower than the first dose.

The first and second regions 112a and 112b are formed on both sides of the channel region 112. The third and fourth regions 112c and 112d are formed adjacent to the first and second regions 112a and 112b, respectively. Width of the first and second regions 112a and 112b is a first length L1. Width of the third and fourth regions 112c and 112d is a second length L2. A polysilicon region 112e is formed between the third and fourth regions 112c and 112d, and width of the polysilicon region 112e is a third length L3.

The first insulating layer 113 is formed over the first transparent substrate 111 having the channel layer 112. The first insulating layer 113 includes contact holes 113a and 113b through which the first and second regions 112a and 112b are partially exposed.

The first signal line 114 is formed on the first insulating layer 113, and the first signal line 114 is extended to the first electrode 114a. The first electrode 114a is formed on the first insulating layer 113 corresponding to the polysilicon region 112e. A width of the first electrode 114a is substantially equal to the third length L3.

The second insulating layer 115 is formed over the first transparent substrate 111 having the first signal line 114. The second insulating layer 115 includes first and second contact holes 115a and 115b through which the first and second regions 112a and 112b are partially exposed.

The second and third signal lines 116 and 117 are formed on the second insulating layer 115.

The second signal line 116 is electrically connected to the first region 112a through the first contact hole 115a. The third signal line 117 is electrically connected to the second region 112b through the second contact hole 115b.

The pixel electrode 118 formed on the second insulating layer 115 is connected to the third signal line 117. The pixel electrode 118 and the third signal line 117 are formed with the second insulating layer 115. The pixel electrode 118 includes indium zinc oxide (IZO) that is transparent and conductive. An etchant for patterning the indium zinc oxide such as an oxalic acid does not etch the second and third signal lines 116 and 117.

The etchant for patterning the indium tin oxide (ITO), however, may etch the second signal line 116 or the third signal line 117. When the second signal line 116 or the third signal line 117 is etched, the second signal line 116 or the third signal line 117 may be disconnected or have increased resistance.

Therefore, the etchant for patterning the indium zinc oxide prevents the second and third signal lines 116 and 117 from being disconnected or having increased resistance.

Also, the display pixel is formed without a protecting layer, thereby simplifying manufacturing process.

Method of Manufacturing Display Pixel

Figure 4:
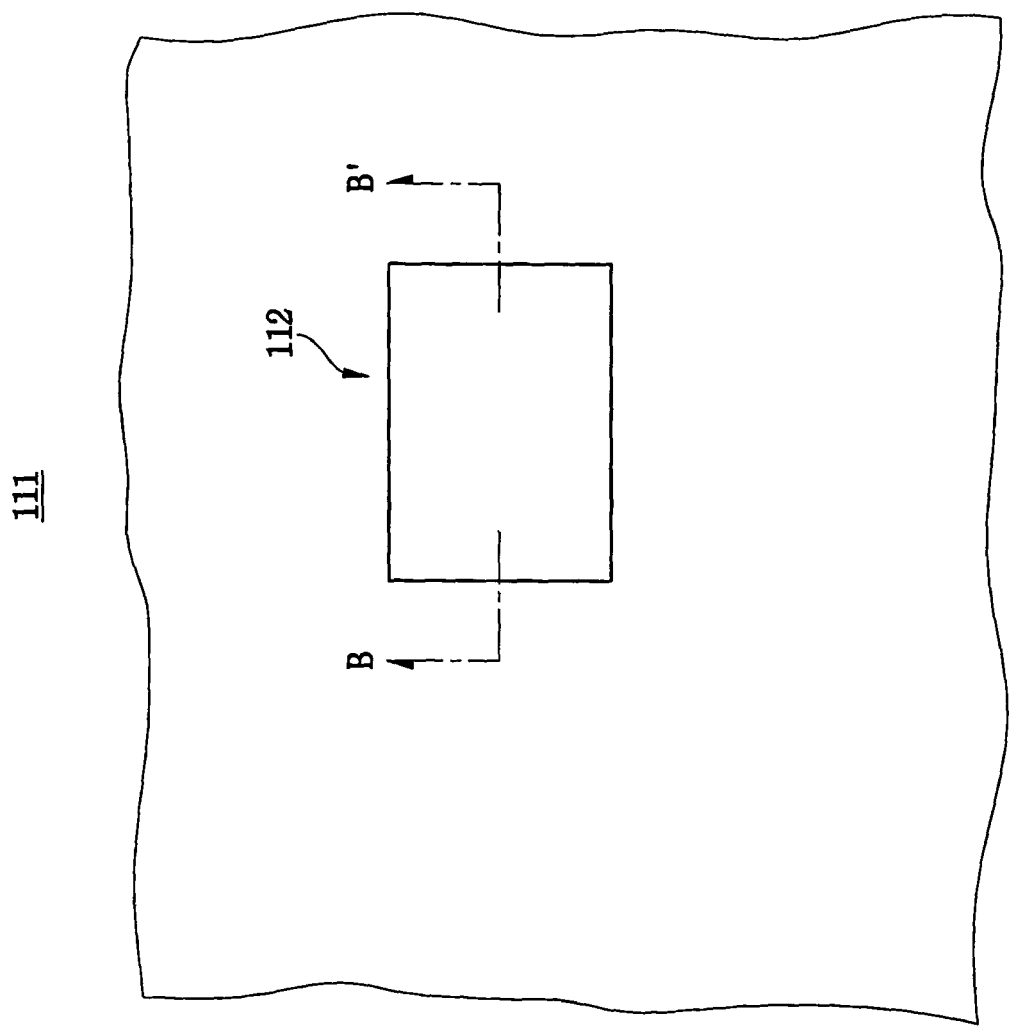
FIG. 4 is a plan view showing a channel layer formed on a transparent substrate according to another exemplary embodiment of the present invention.
Figure 5:
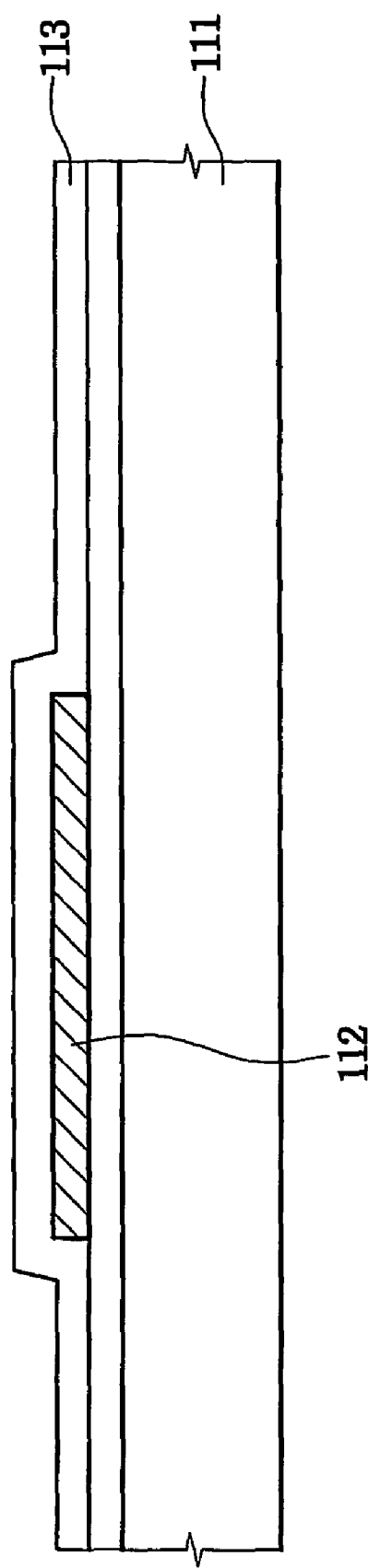
FIG. 5 is a cross-sectional view showing B-B' line of FIG. 4.

FIG. 4 is a plan view showing a channel layer formed on a transparent substrate according to another exemplary embodiment of the present invention, and FIG. 5 is a cross-sectional view showing B-B' line of FIG. 4.

Referring to FIGS. 4 and 5, an amorphous silicon thin film is deposited on a transparent substrate 111, and a laser beam is irradiated onto the amorphous silicon thin film to form the polysilicon thin film. The polysilicon thin film is patterned to form a channel layer 112 on the transparent substrate 111. Preferably, the channel layer 112 includes a thin film having a rectangular shape.

A first insulating layer 113 is formed over the transparent substrate 111 having the channel layer 112.

Figure 6:
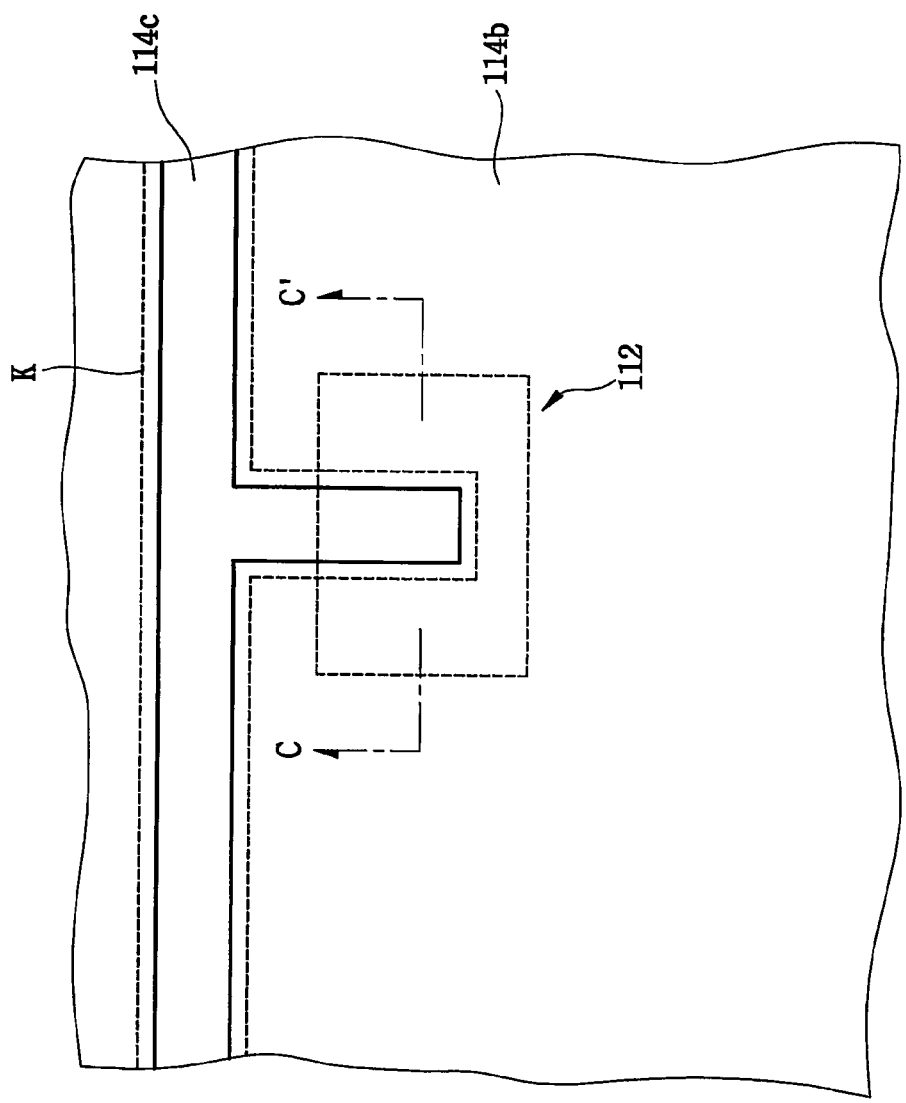
FIG. 6 is a plan view showing a lightly doped drain (LDD) structure and a first signal line disposed corresponding to a channel layer according to an exemplary embodiment of the present invention.
Figure 7:
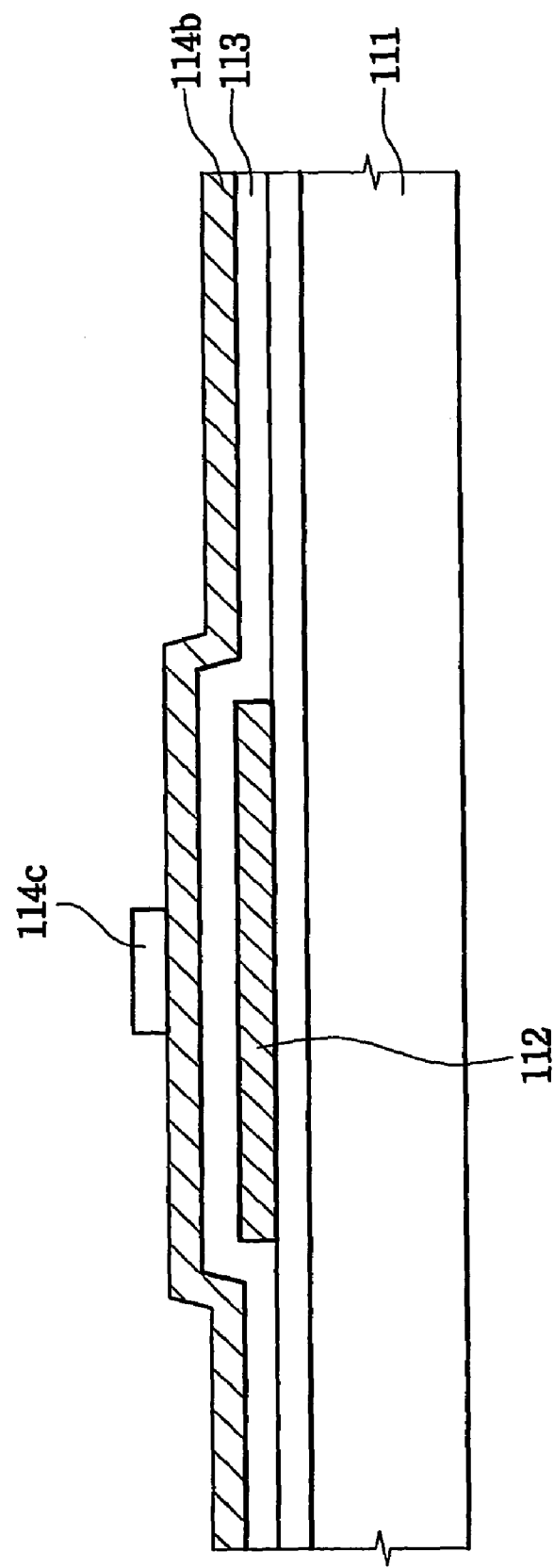
FIG. 7 is a cross-sectional view showing C-C' line of FIG. 6.

FIG. 6 is a plan view showing an LDD structure and a first signal line disposed corresponding to a channel layer according to an exemplary embodiment of the present invention, and FIG. 7 is a cross-sectional view showing C-C' line of FIG. 6.

Referring to FIGS. 6 and 7, a gate metal thin film 114b is formed over the first insulating layer 113. The gate metal thin film 114b is patterned to form a first signal line 114.

A heat resistant photoresist thin film is coated over the gate metal thin film 114b. The heat resistant photoresist thin film is patterned using the second pattern mask to form an ion mask 114c disposed over a region K corresponding to the first signal line.

The gate metal thin film 114b is patterned using an etchant or etching gas to form the first signal line 114 and to allow the ion stopper to be under-cut. An under-cut is formed under the ion mask 114c. Impurities having different concentrations may be disposed on the channel layer 112 because of the under-cut.

Figure 8:
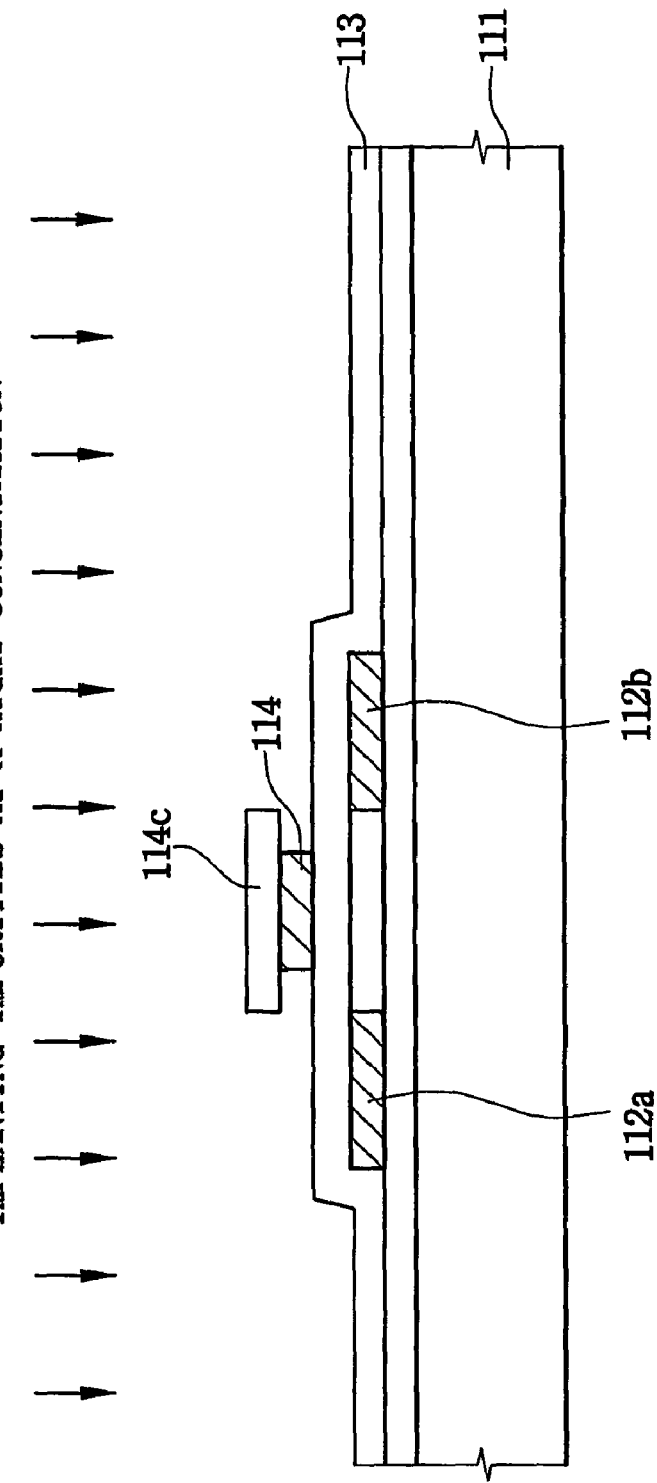
FIG. 8 is a cross-sectional view showing a channel layer implanted with impurities at a high concentration according to an exemplary embodiment of the present invention.

FIG. 8 is a cross-sectional view showing a channel layer implanted with impurities at a high concentration according to an exemplary embodiment of the present invention.

Referring to FIG. 8, the channel layer 112 without the ion mask 114c is implanted with impurities at high concentration, and the ion mask 114c is also implanted with the impurities at a high concentration.

Figure 9:
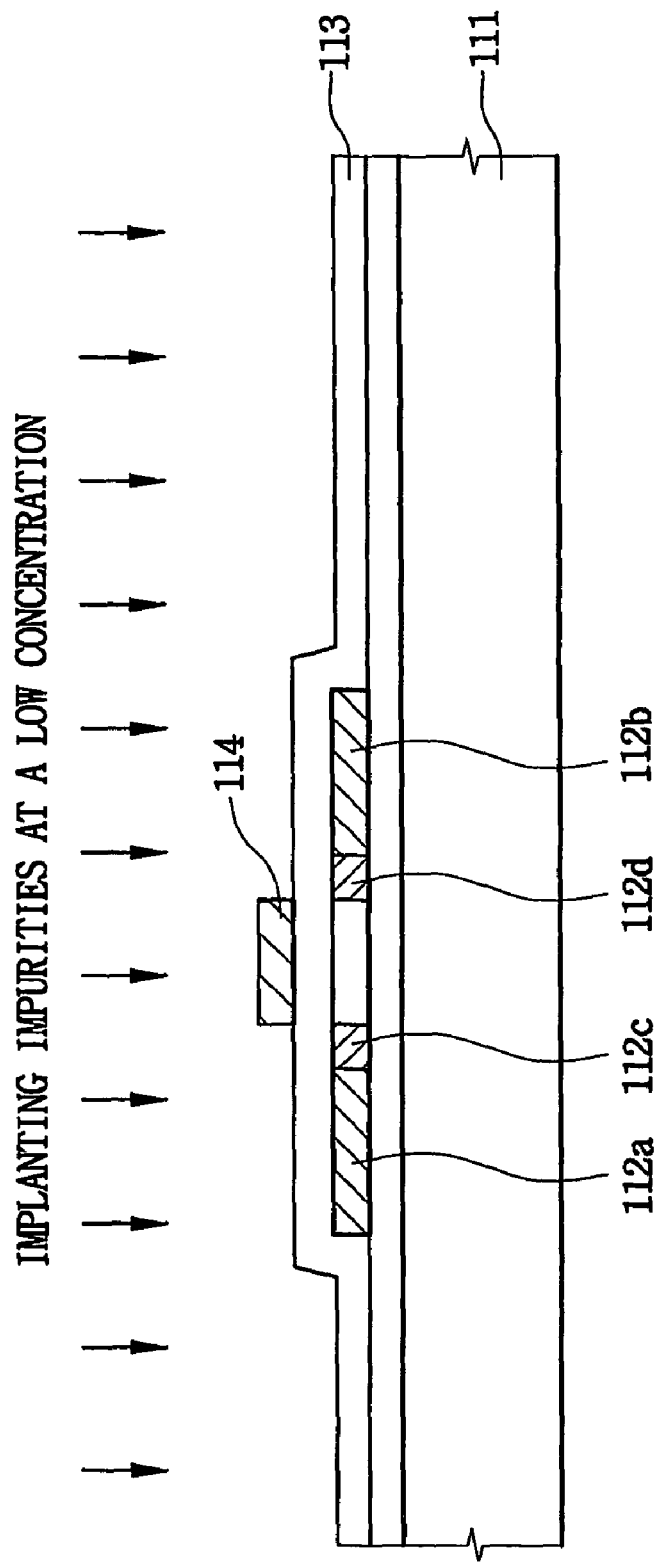
FIG. 9 is a cross-sectional view showing a channel layer implanted with impurities at a low concentration according to an exemplary embodiment of the present invention.

FIG. 9 is a cross-sectional view showing a channel layer implanted with impurities at a low concentration according to an exemplary embodiment of the present invention.

Referring to FIG. 9, the ion mask 114c is stripped by a stripping process such as an etching process. The channel layer 112 is implanted with impurities at a low concentration to form third and fourth regions 112c and 112d. The third and fourth regions are represented by reference numerals "112c" and "112d". Therefore, a first region 112a and a second region 112b are disposed adjacent to the third and fourth regions 112c and 112d. The channel layer 112 corresponding to the first signal line 114 is adjacent to the third and fourth regions 112c and 112d.

Figure 10:
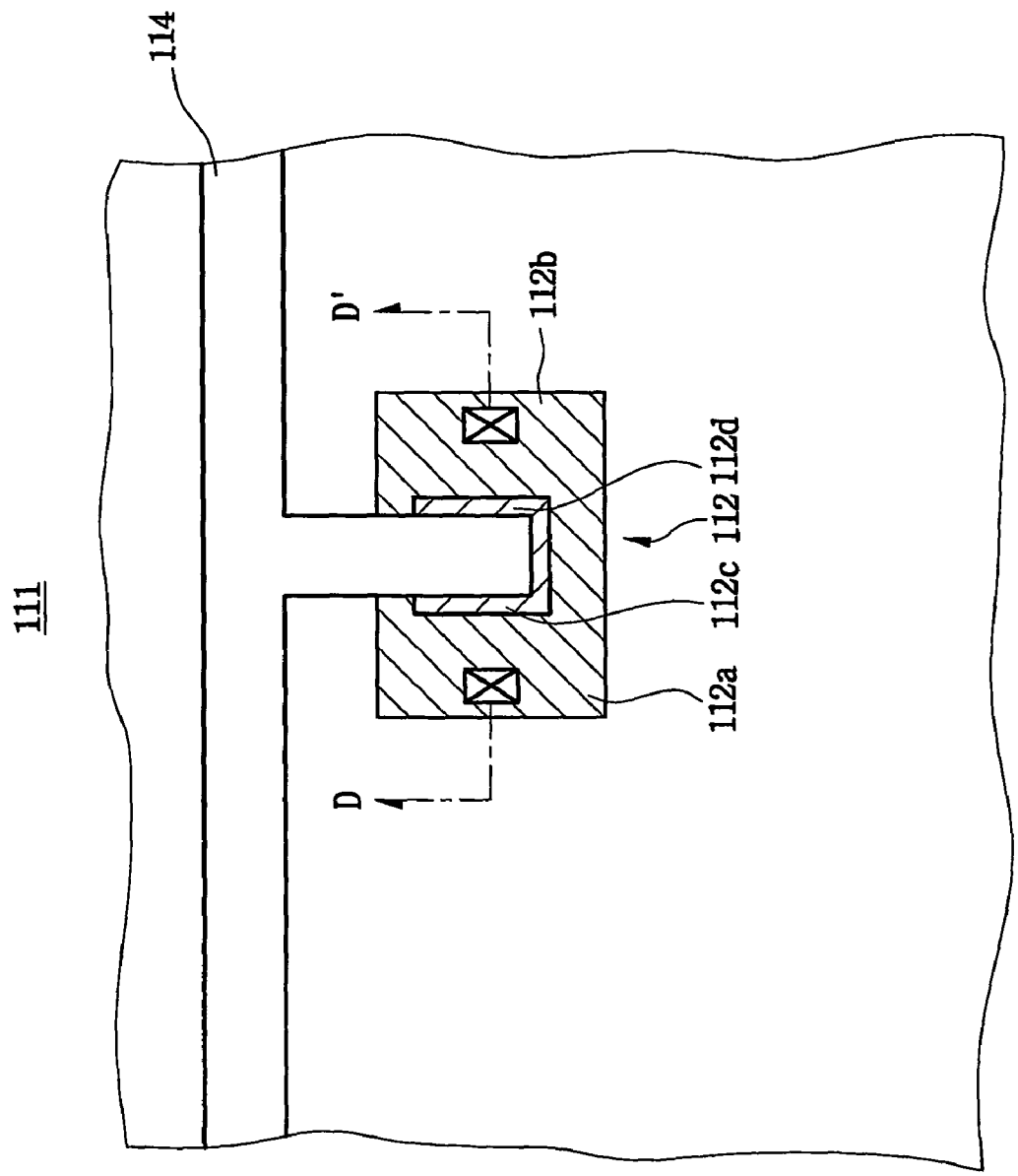
FIG. 10 is a plan view showing contact holes formed corresponding to first and second regions according to an exemplary embodiment of the present invention.
Figure 11:
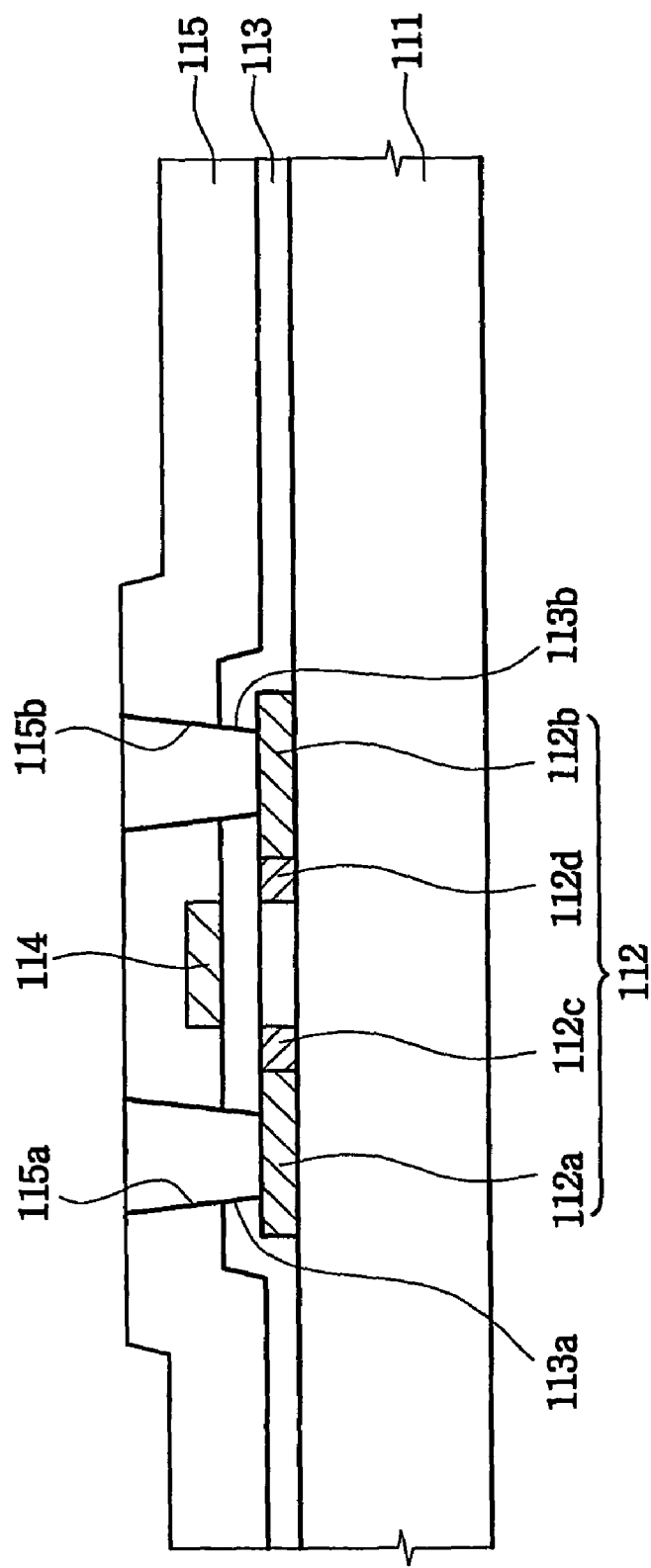
FIG. 11 is a cross-sectional view showing D-D' line of FIG. 10.

FIG. 10 is a plan view showing contact holes formed corresponding to first and second regions according to an exemplary embodiment of the present invention, and FIG. 11 is a cross-sectional view showing D-D' line of FIG. 10.

Referring to FIGS. 10 and 11, the second insulating layer 115 is formed over the transparent substrate 111 having the first signal line 114.

A first contact hole 115a and a second contact hole 115b are formed in the second insulating layer 115 using the third pattern mask. The first and second regions 112a and 112b are partially exposed through the first and second contact holes 115a and 115b. The first contact hole 115a is opposite to the second contact hole 115b by interposing the first signal line 114 therebetween.

The first and second contact holes 115a and 115b of the second insulating layer 115 are formed with contact holes 113a and 113b of the first insulating layer 113.

Figure 12:
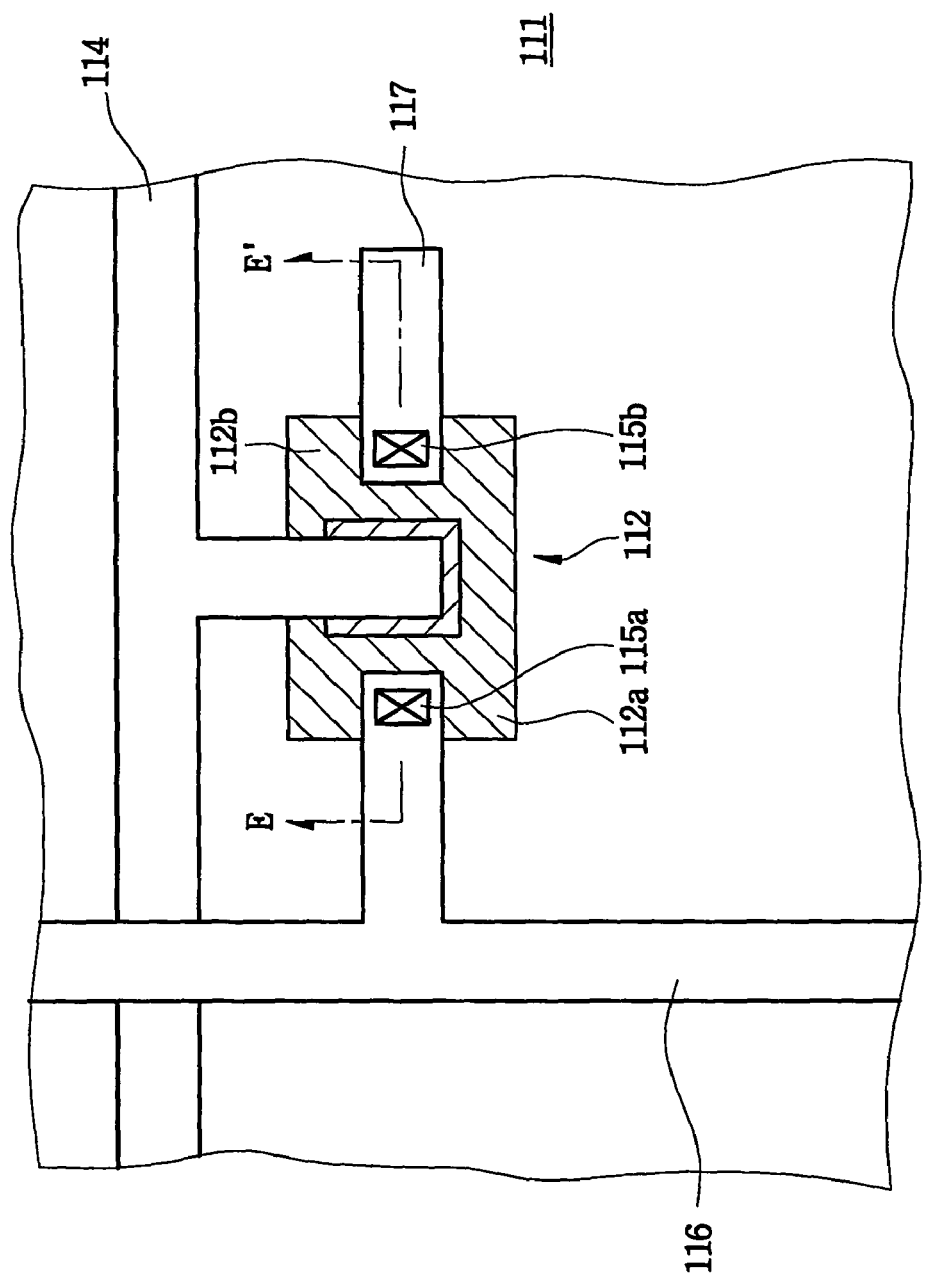
FIG. 12 is a plan view showing second and third signal line according to an exemplary embodiment.
Figure 13:
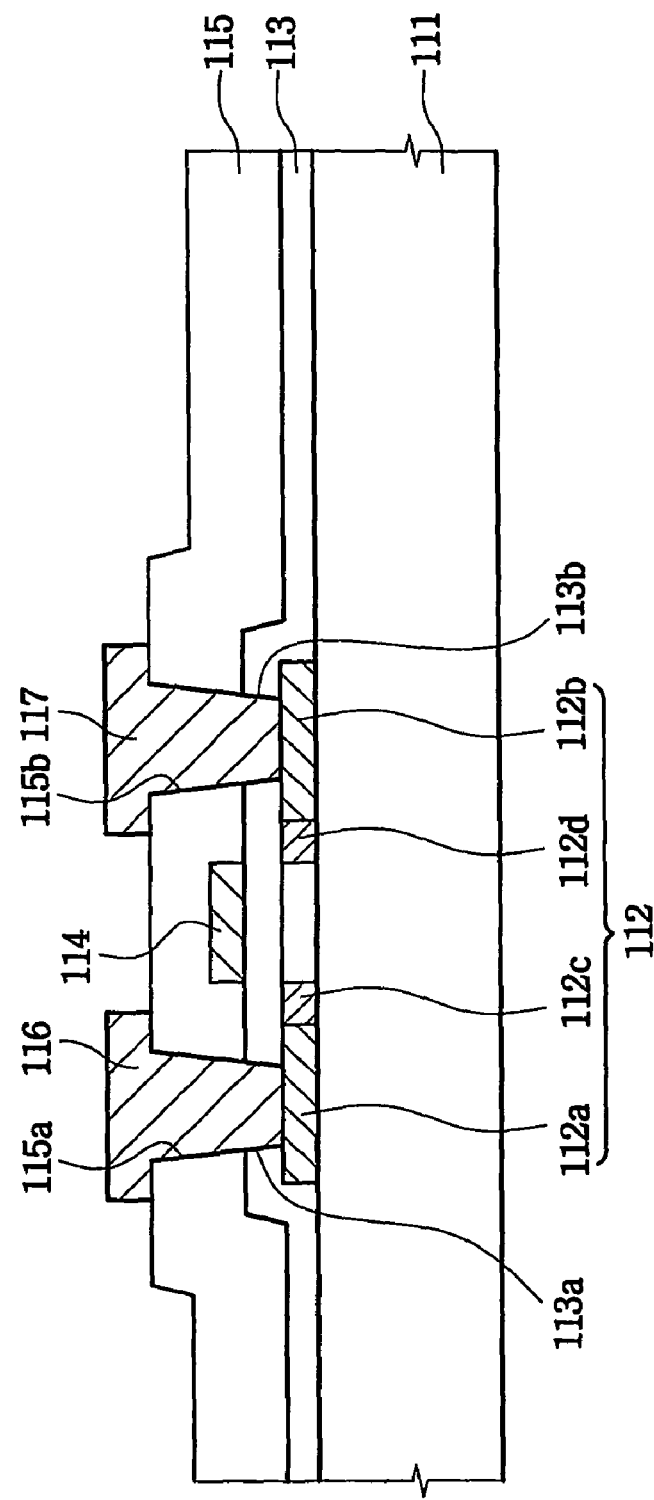
FIG. 13 is a cross-sectional view showing E-E' line of FIG. 12.

FIG. 12 is a plan view showing second and third signal line according to an exemplary embodiment, and FIG. 13 is a cross-sectional view showing E-E' line of FIG. 12.

Referring to FIGS. 12 and 13, a metal thin film is formed on the second insulating layer 115. The metal thin film is patterned using the fourth pattern mask to form second and third signal lines 116 and 117.

The second signal line 116 is perpendicular to the first signal line 114, and the second signal line 116 is electrically connected to the first region 112a of the channel layer 112 through the first contact hole 115a.

The third signal line 117 is formed with the second signal line 116. The third signal line 117 is parallel with the first signal line 114, and electrically connected to the second region 112b of the channel layer 112 through the second contact hole 115b.

Figure 1:
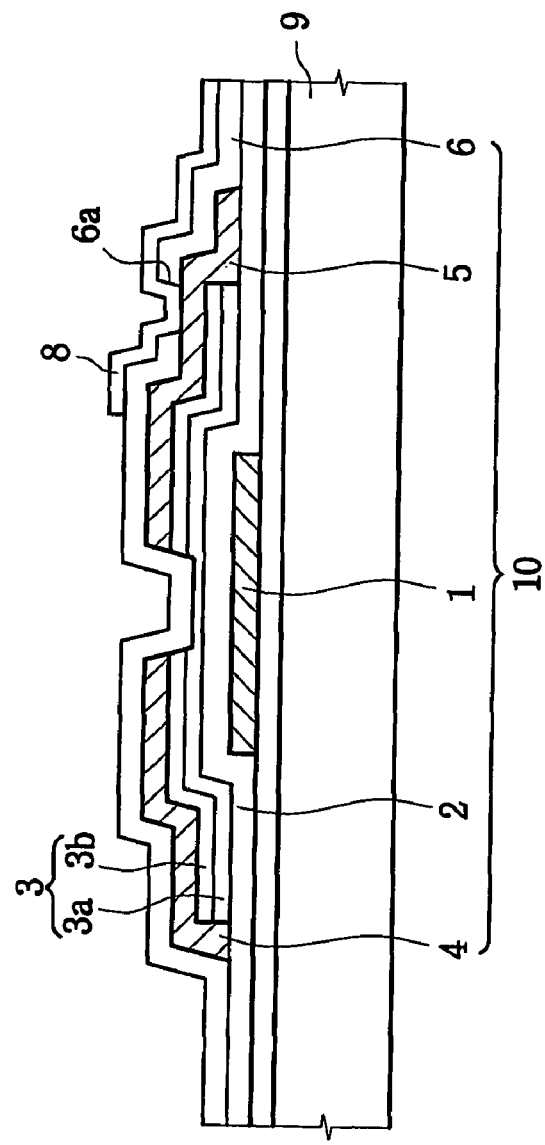
FIG. 1 is a cross-sectional view showing a conventional TFT.

Now referring to FIGS. 1 and 2, indium zinc oxide material is formed over the second insulating layer 115 to form an indium zinc oxide layer. The indium zinc oxide layer is patterned using the fourth pattern mask and indium zinc oxide etchant.

The indium zinc oxide etchant may not etch the second and third signal lines 116 and 117. Therefore, although etching time for the indium zinc oxide layer is no less than a predetermined etching time or thickness of the indium zinc oxide layer is no more than a predetermined thickness, the second and third signal lines 116 and 117 may substantially not etched by the indium zinc oxide etchant.

Therefore, the indium zinc oxide is used to form the pixel electrode 118 so that a step of forming a protecting layer for protecting the second and third signal lines 116 and 117 and a step of forming a contact hole in the protecting layer may be omitted, thereby simplifying manufacturing process of the display pixel.

Display Apparatus

Figure 14:
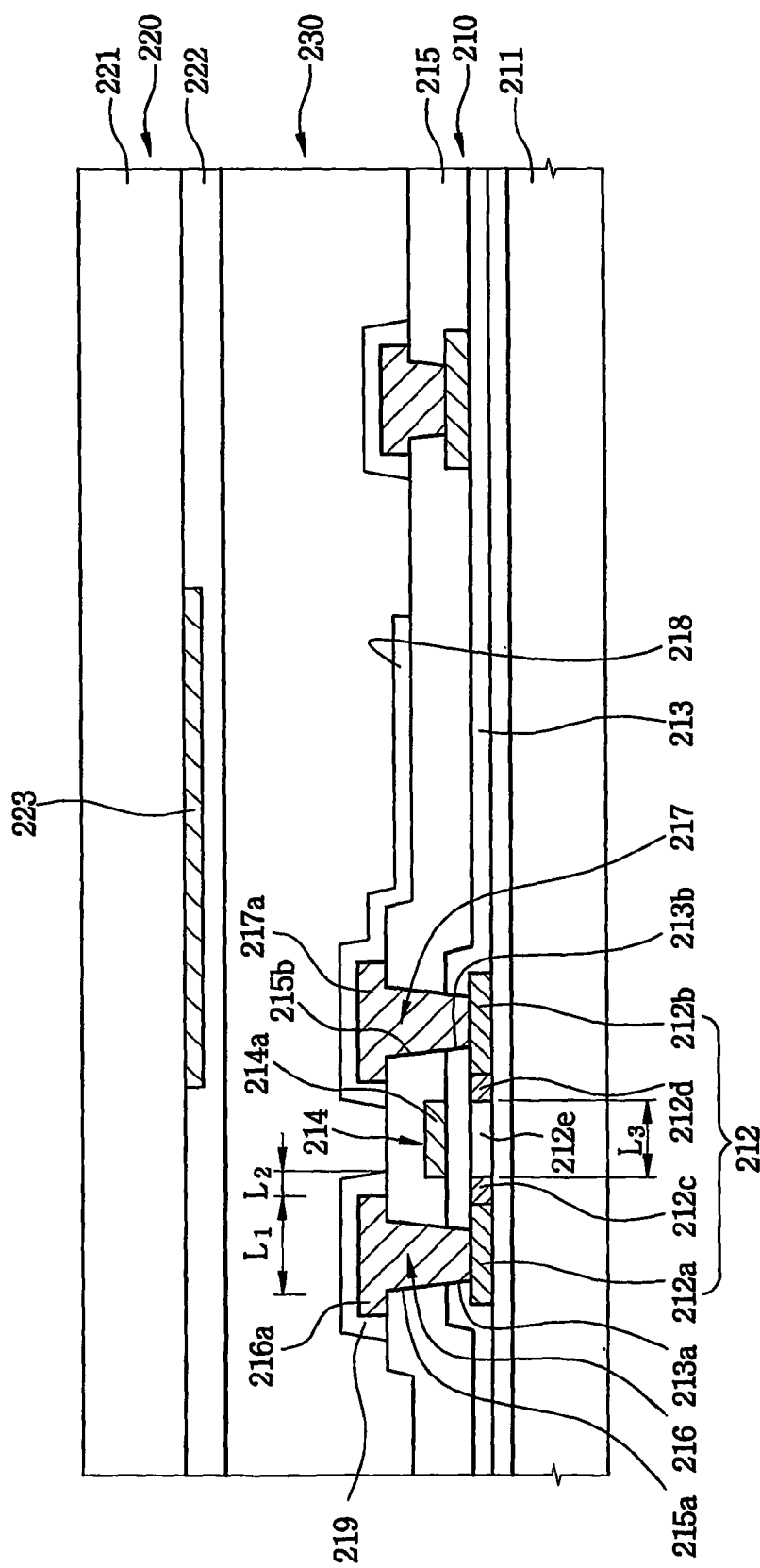
FIG. 14 is a cross-sectional view showing a display apparatus according to another exemplary embodiment of the present invention.

FIG. 14 is a cross-sectional view showing a display apparatus according to another exemplary embodiment of the present invention.

Referring to FIG. 14, a display apparatus 200 includes a first substrate 210, a second substrate 220 and a liquid crystal layer 230.

The first substrate 210 includes a first transparent substrate 211, a channel layer 212, a first insulating layer 213, a first signal line 214, a second insulating Layer 215, a second signal line 216, a third signal line 217, a pixel electrode 218 and an etch stop layer 219.

The first transparent substrate 211 includes a transparent glass substrate having high light transmittance.

The channel layer 212 is formed on the first transparent substrate 211. The channel layer 212 includes amorphous silicon thin film having a rectangular shape.

The channel layer includes first and second regions 212a and 212b implanted with impurities at a high concentration of a first dose, and third and fourth regions 212c and 212d implanted with impurities at a low concentration of a second dose smaller than the first dose.

The first and second regions 212a and 212b are formed on both sides of the channel region 212. The third and fourth regions 212c and 212d are formed adjacent to the first and second regions 212a and 212b, respectively. Width of the first and second regions 212a and 212b is a first length L1. Width of the third and fourth regions 212c and 212d is a second length L2. A polysilicon region 212e is formed between the third and fourth regions 212c and 212d, and width of the polysilicon region 212e is a third length L3.

The first insulating layer 213 is formed over the first transparent substrate 211 having the channel layer 212. The first insulating layer 213 includes contact holes 213a and 213b through which the first and second regions 212a and 212b are partially exposed.

The first signal line 214 is formed on the first insulating layer 213, and the first signal line 214 is extended to the first electrode 214a. The first electrode 214a is formed on the first insulating layer 213 corresponding to the polysilicon region 212e. A width of the first electrode 214a is substantially equal to the third length L3.

The second insulating layer 215 is formed over the first transparent substrate 211 having the first signal line 214. The second insulating layer 215 includes a first contact hole 215a and a second contact hole 215b, through which the first and second regions 212a and 212b are partially exposed.

The second and third signal lines 216 and 217 are formed on the second insulating layer 215.

The second signal line 216 is connected to a second electrode 216a. The second electrode 216a is electrically connected to the first region 212a through the first contact hole 215a. The third signal line 217 is connected to a third electrode 217a. The third electrode 217a is electrically connected to the second region 212b through the second contact hole 215b.

The pixel electrode 218 connected to the third signal line 217 is formed on the second insulating layer 215. The pixel electrode 218 includes indium zinc oxide (ITO) that is transparent and conductive.

The etch stop layer 219 is formed over the first transparent substrate 211 having the second signal line 216 so as to prevent the second and third signal lines 216 and 217 from being etched during forming the pixel electrode 218. The etch stop layer 219 includes indium tin oxide layer.

A common electrode 222 is formed over the second transparent substrate 221. A color filter 223 may be disposed between the second transparent substrate 221 and the common electrode 222.

Liquid crystal is injected between the first substrate 210 and the second substrate 220 to form the liquid crystal layer 230.

Figure 15:
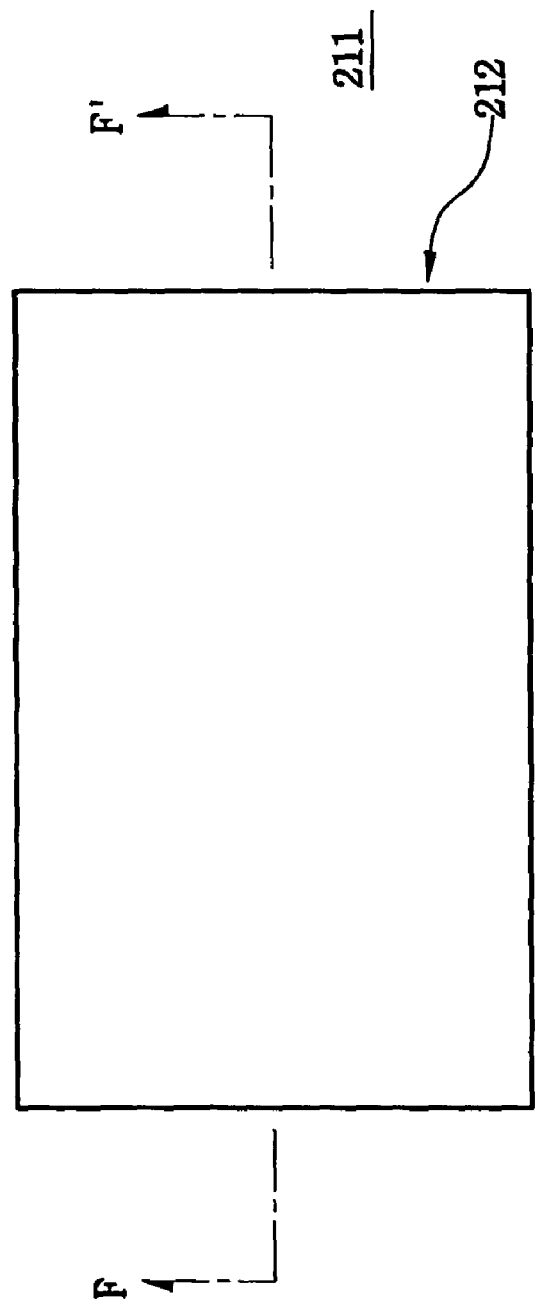
FIG. 15 is a plan view showing a channel region formed on a first transparent substrate according to another exemplary embodiment.
Figure 16:
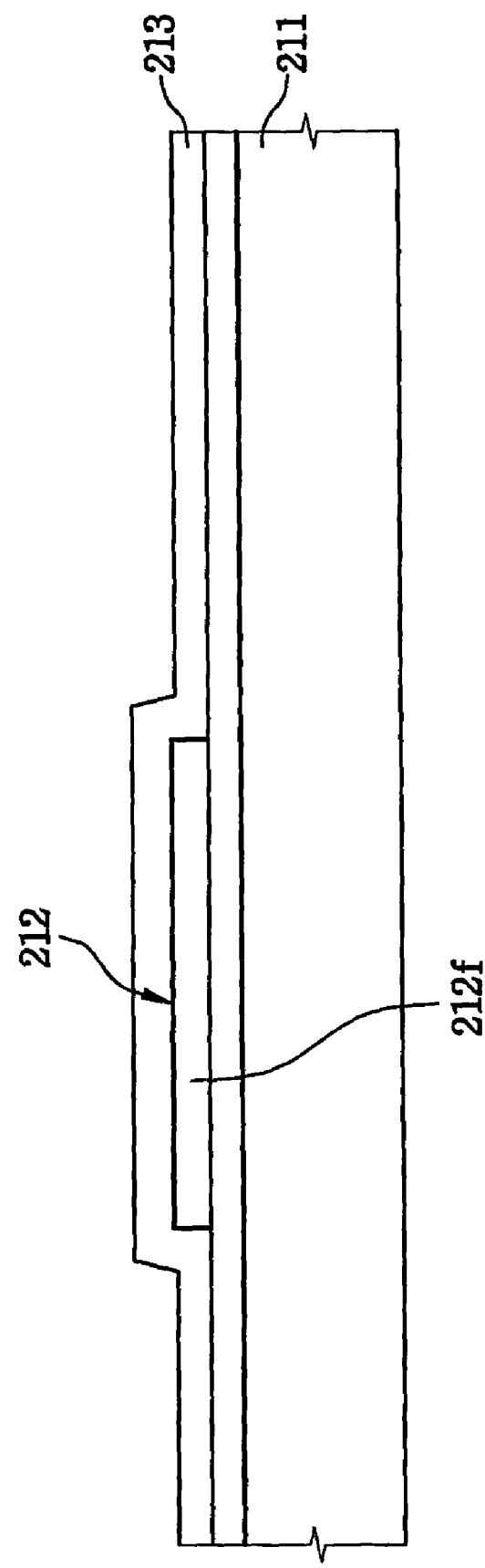
FIG. 16 is a cross-sectional view showing F-F' line of FIG. 15.

FIG. 15 is a plan view showing a channel region formed on a first transparent substrate according to another exemplary embodiment, FIG. 16 is a cross-sectional view showing F-F' line of FIG. 15.

Referring to FIGS. 15 and 16, an amorphous silicon thin film 212f is deposited on the first transparent substrate 211. The amorphous silicon thin film 212f is patterned to form the channel layer 212 on the first transparent substrate 211. The channel layer 212 has a rectangular shape.

The first insulating layer 213 is formed over the first transparent substrate 211 having the channel layer 212.

Figure 17:
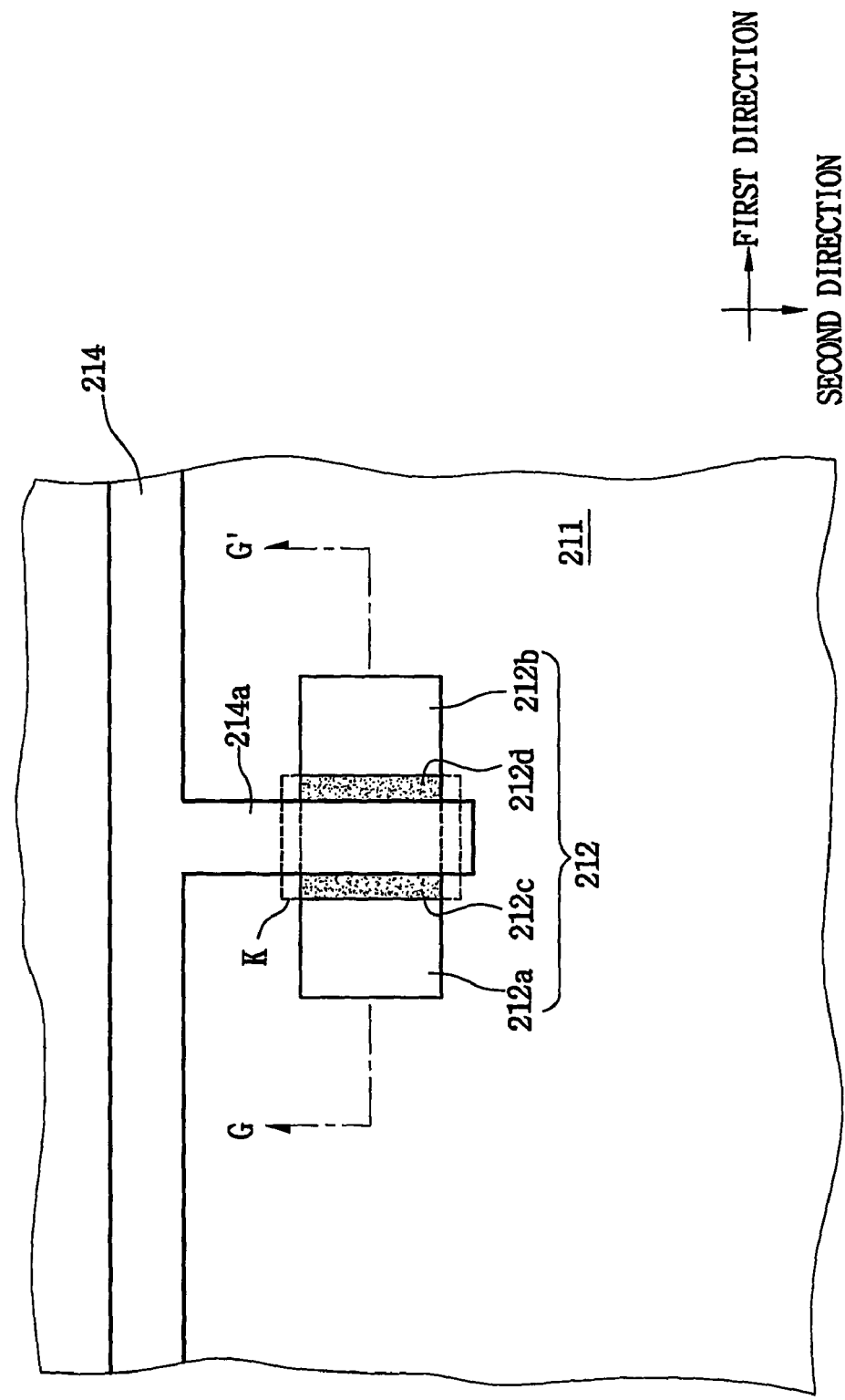
FIG. 17 is a plan view showing a lightly doped drain (LDD) structure and a first signal line formed corresponding to a channel layer according to another exemplary embodiment of the present invention.
Figure 18:
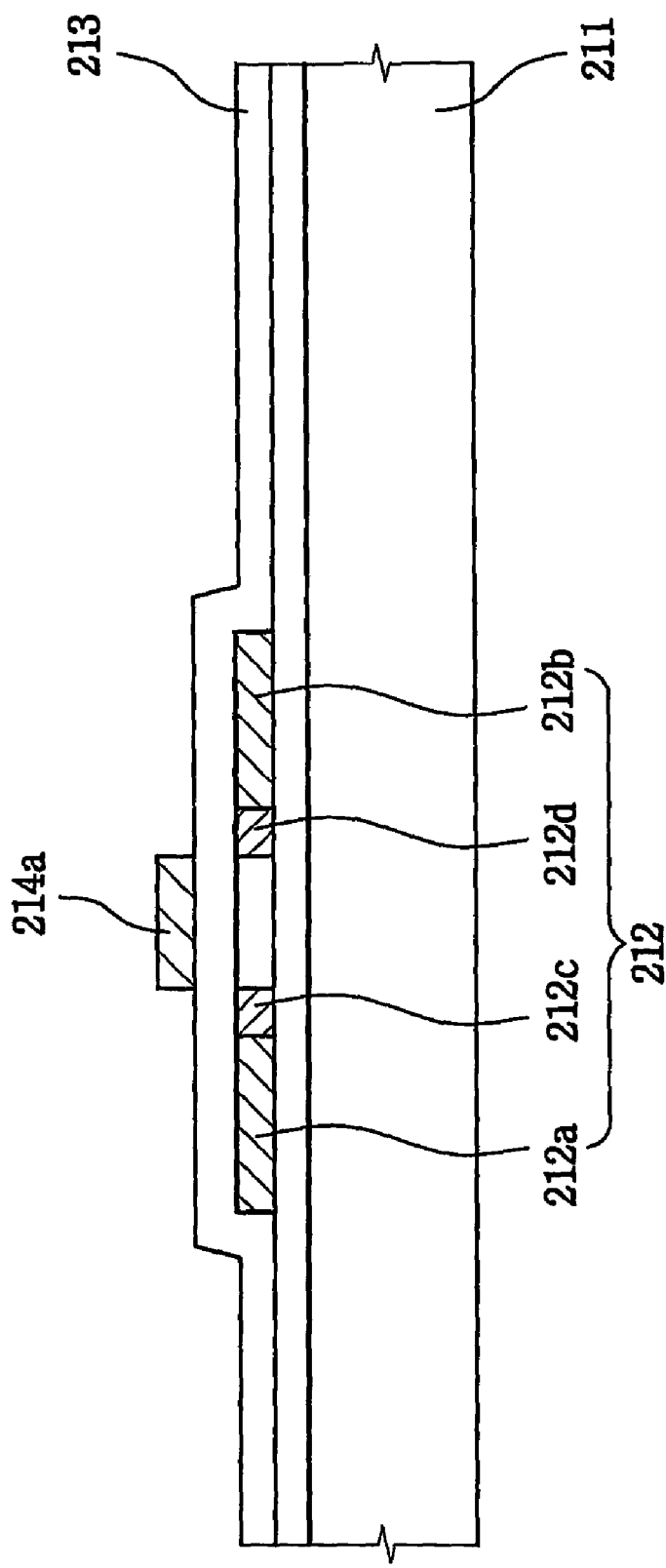
FIG. 18 is a cross-sectional view showing G-G' line of FIG. 17.

FIG. 17 is a plan view showing a lightly doned drain (LDD) structure and a first signal line formed corresponding to a channel layer according to another exemplary embodiment of the present invention, and FIG. 18 is a cross-sectional view showing G-G' line of FIG. 17.

Referring to FIGS. 17 and 18, a gate metal thin film is deposited over the first insulating layer 213. The gate metal thin film is patterned to form the first signal line 214 and the first electrode 214a.

The first signal line 214 is extended in a first direction. The first electrode 214a is connected to the first signal line 214, and extended in a second direction perpendicular to the first direction.

An ion mask (not shown) is formed over a region K corresponding to the first signal line 214. The first and second regions implanted with impurities at a high concentration are represented by reference numerals 212a and 212b. The ion mask is then stripped. The channel layer 212 is implanted with impurities at a low concentration to form the third and fourth regions. The third and fourth regions implanted with the impurities at a low concentration are represented by reference numerals "212c" and "212d". Therefore, The first and second regions 212a and 212b are disposed adjacent to the third and fourth regions 212c and 212d. The first region 212a and a portion of the channel region 112 corresponding to the first electrode 214a have the third region 212c therebetween, and the second region 212b and the portion of the channel region 112 corresponding to the first electrode 214a have the fourth region 212d therebetween.

Figure 19:
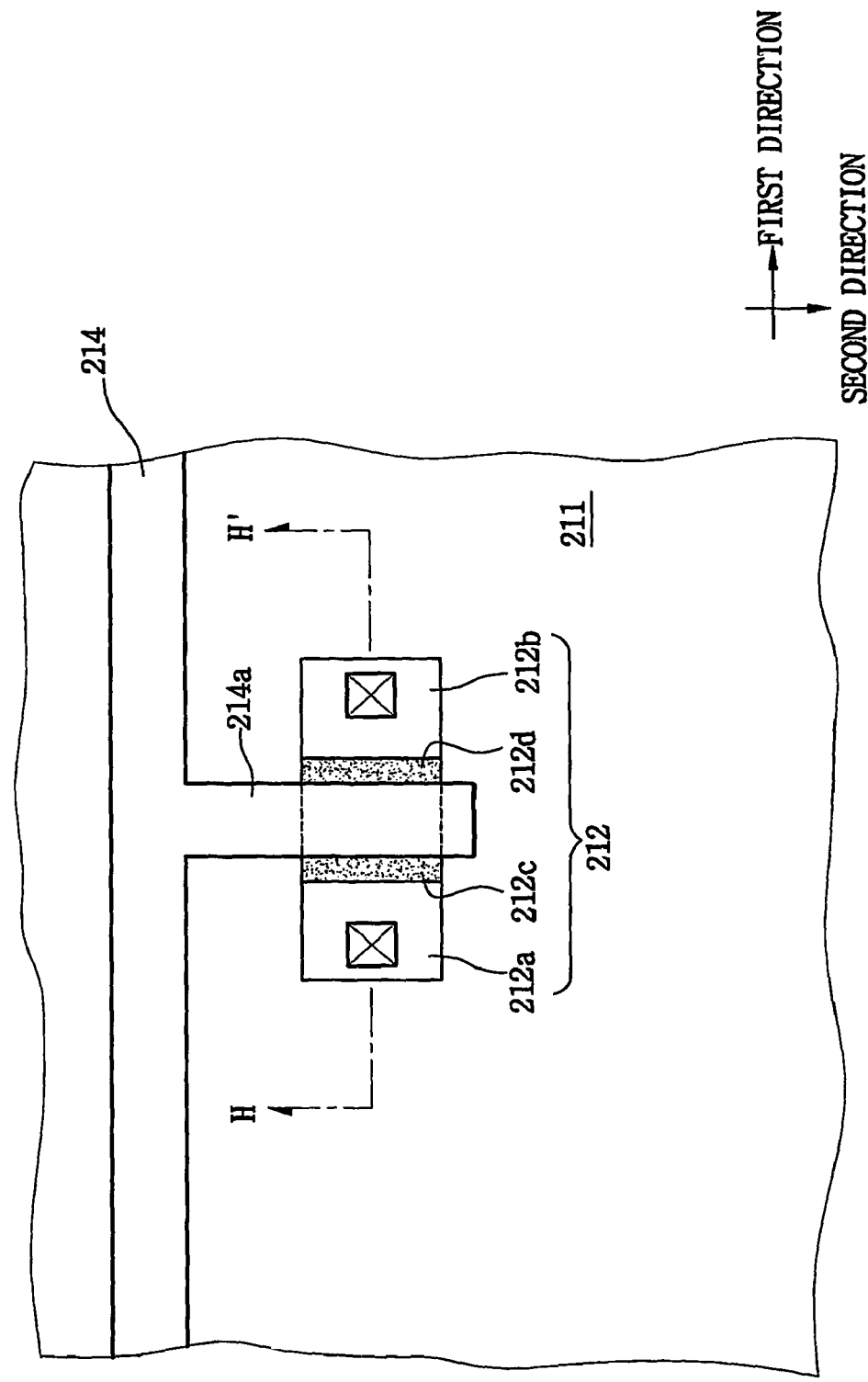
FIG. 19 is a plan view showing a contact hole formed in first and second regions according to another exemplary embodiment of the present invention.
Figure 20:
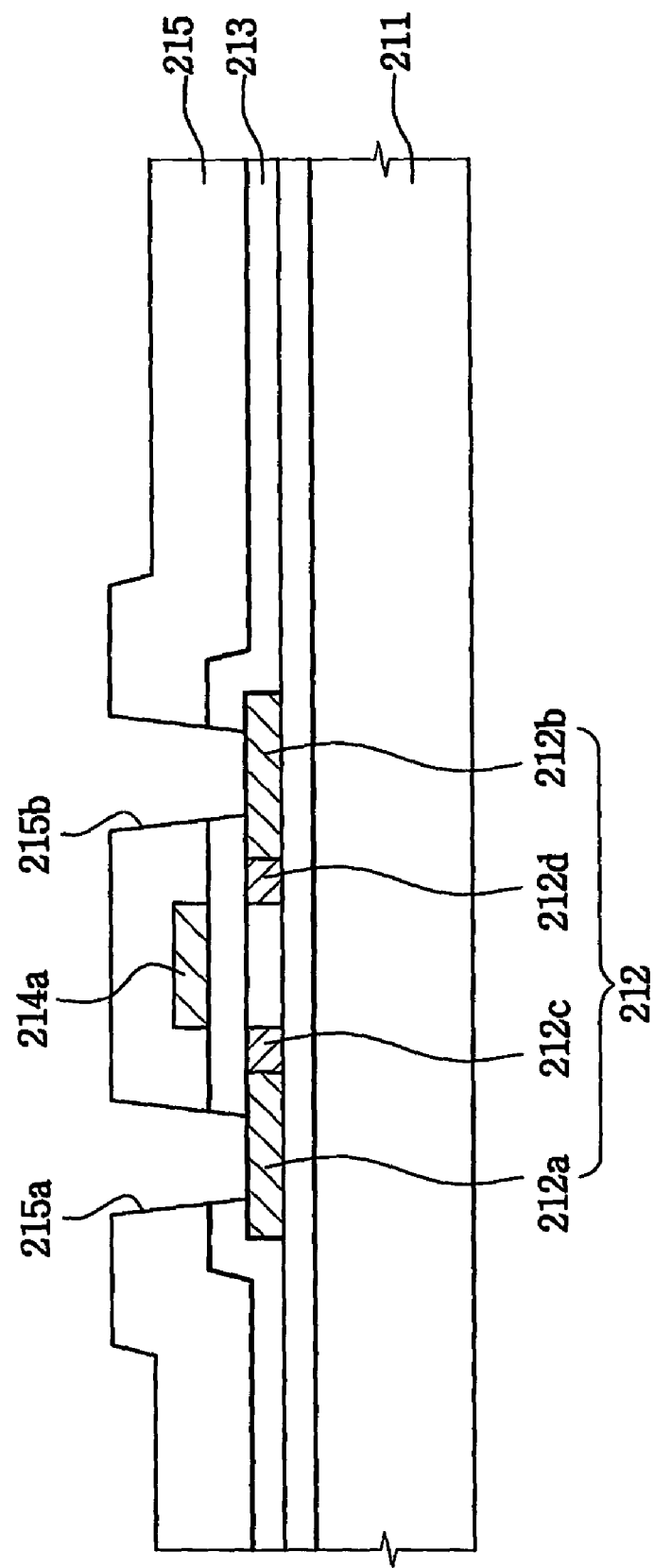
FIG. 20 is a cross-sectional view showing H-H' line of FIG. 19.

FIG. 19 is a plan view showing a contact hole formed in a first region according to another exemplary embodiment of the present invention, and FIG. 20 is a cross-sectional view showing H-H' line of FIG. 19.

Referring to FIGS. 19 and 20, the second insulating layer 215 is formed over the first transparent substrate 211 having the first signal line 214 and the first electrode 214a.

The first and second contact holes 215a and 215b are formed in the second insulating layer 215. The first and second regions 212a and 212b are partially exposed through the first and second contact holes 215a and 215b. The first contact hole 215a is opposite to the second contact hole 215b by interposing the first electrode 214a therebetween.

The contact holes 213a and 213b of the first insulating layer 213 are formed together with the first and second contact holes 215a and 215b of the second insulating layer 215, respectively.

Figure 21:
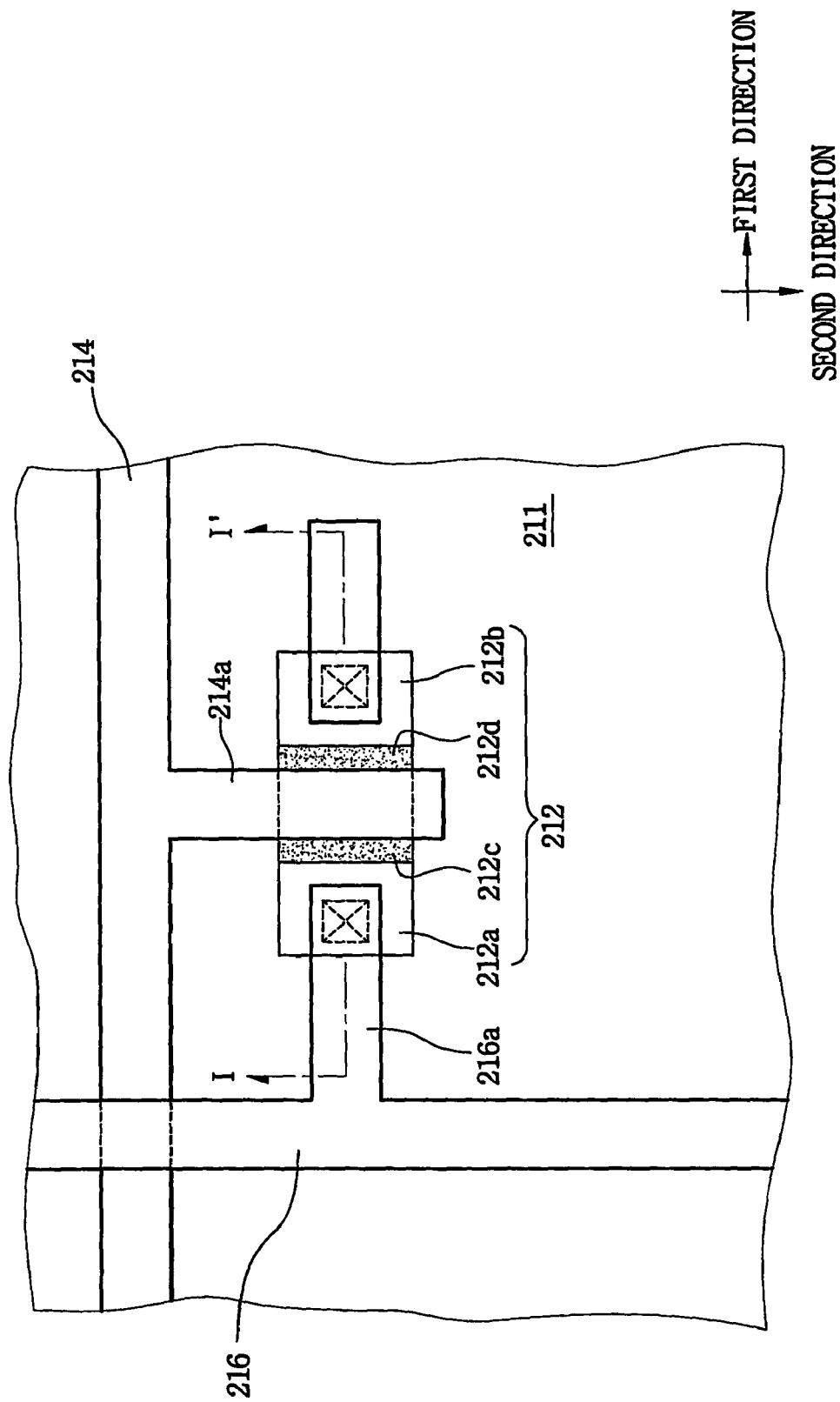
FIG. 21 is a plan view showing a second and third signal line according to another exemplary embodiment of the present invention.
Figure 22:
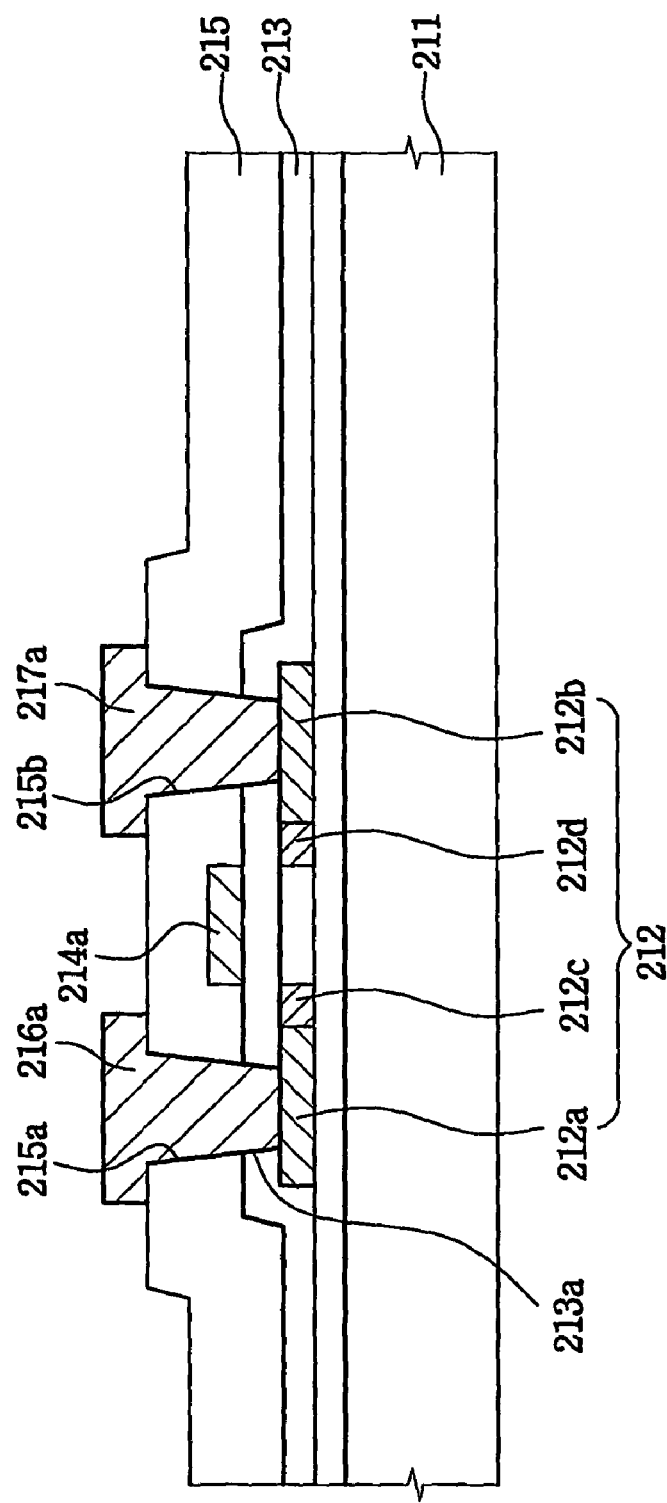
FIG. 22 is a cross-sectional view showing I-I' line of FIG. 21.

FIG. 21 is a plan view showing a second and third signal line according to another exemplary embodiment of the present invention, and FIG. 22 is a cross-sectional view showing I-I' line of FIG. 21.

Referring to FIGS. 21 and 22, a metal thin film is deposited over the second insulating layer 215. The metal thin film is patterned to form the second and third signal lines 216 and 217.

The second signal line 216 is extended in the second direction perpendicular to the first signal line 214. The second electrode 216a is connected to the second signal line 216, and extended in the first direction. The second electrode 216a is electrically connected to the first region 212a of the channel layer 212 through the contact holes 215a and 213a.

The third signal line 217 is formed with the second signal line 216 and the second electrode 216a. The third signal line 217 is parallel with the first signal line 214. The third signal line 217 is electrically connected to the second region 212b through the contact holes 215b and 213b.

Figure 23:
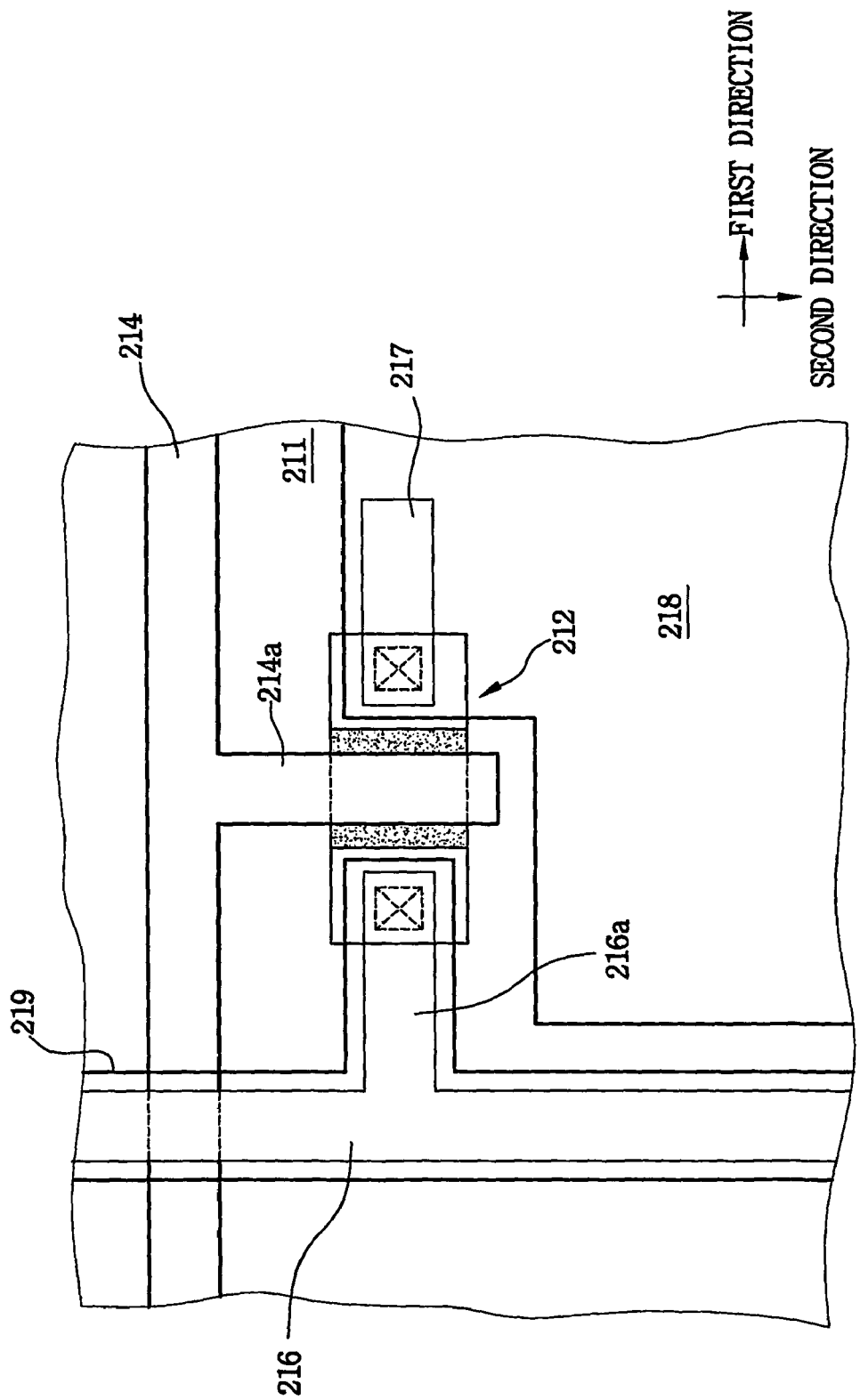
FIG. 23 is a plan view showing a pixel electrode according to another exemplary embodiment of the present invention.

FIG. 23 is a plan view showing a pixel electrode according to another exemplary embodiment of the present invention.

Referring to FIGS. 14 and 23, an indium tin oxide layer is formed over the second insulating layer 215. The indium tin oxide layer is patterned using an etchant.

A portion of the indium tin oxide layer is removed so that the indium tin oxide layer corresponding to the second signal line 216, the second electrode 216a, the third electrode 217a and the third signal line 217 remains.

Therefore, although etching time for the indium tin oxide layer is no less than a predetermined etching time or thickness of the indium tin oxide layer is no more than a predetermined thickness, the second signal line 216, the second electrode 216a, the third electrode 217a and the third signal line 217 may substantially not etched by the etchant because of the remaining indium tin oxide layer thereon.

Therefore, the remained indium tin oxide layer corresponding to the second signal line 216, the second electrode 216a, the third electrode 217a and the third signal line 217 prevents the second signal line 216, the second electrode 216a, the third electrode 27a and the third signal line 217 from being disconnected or having increased resistance.

The remaining indium tin oxide layer corresponding to the second signal line 216 and the second electrode 216a is the etch stop layer 219. The remaining indium tin oxide layer corresponding to the third electrode 217a and the third signal line 217 is the pixel electrode 218.

The common electrode 222 including indium tin oxide layer and the indium zinc oxide layer is formed on the second transparent substrate 221.

The first substrate 210 is combined with the second substrate 220. Liquid crystal is injected into a space between the first and second substrates 210 and 220.

Therefore, the indium tin oxide layer corresponding to the second signal line 216 and the second electrode 216a protects the second signal line 216 and the second electrode 216a. Also, the third signal line 217 and the third electrode 217a make direct contact with the pixel electrode 218 so that the manufacturing process is simplified.

Figure 24:
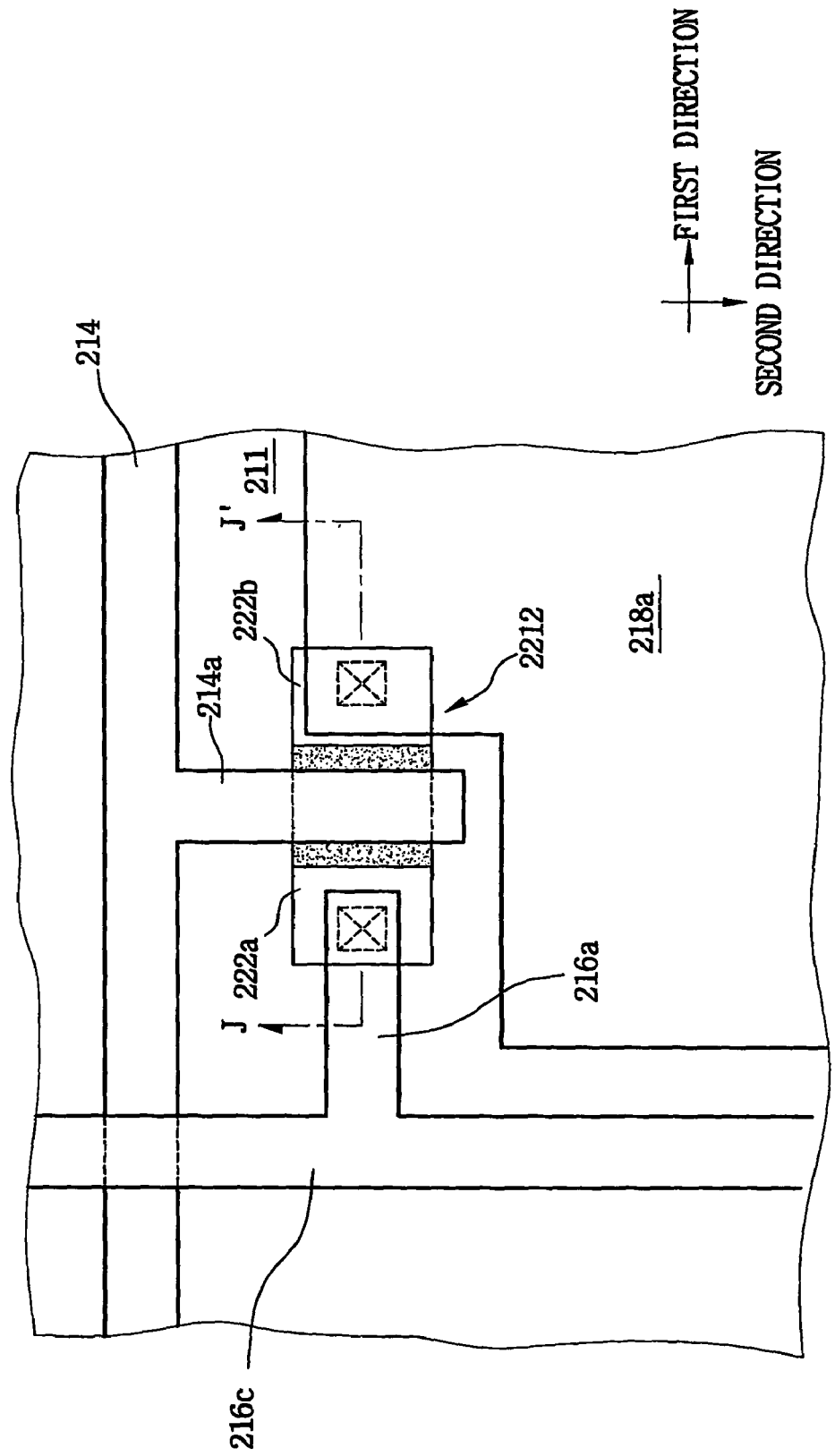
FIG. 24 is a plan view showing a first substrate according to another exemplary embodiment of the present invention.
Figure 25:
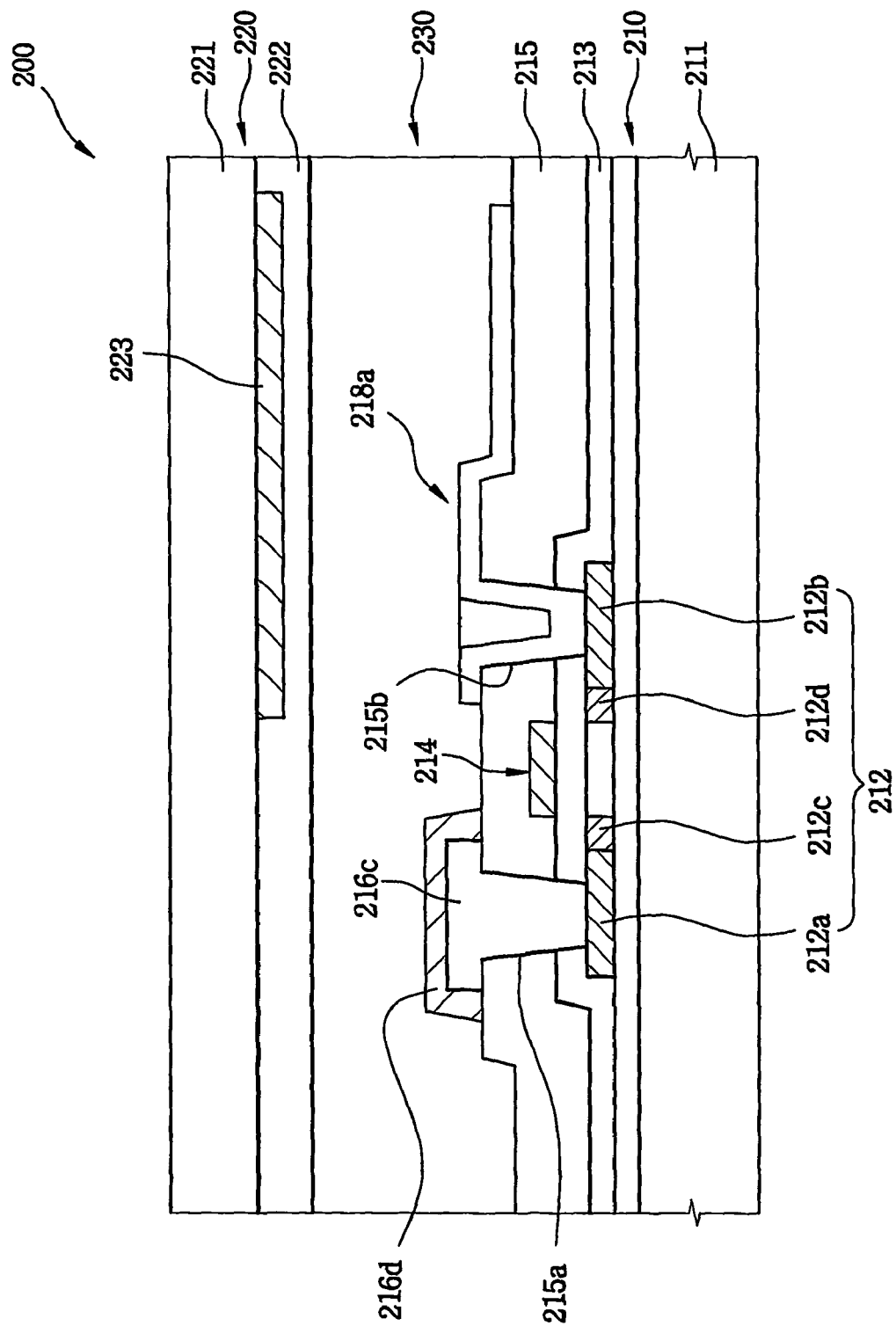
FIG. 25 is a cross-sectional view showing J-J' line of FIG. 24.

FIG. 24 is a plan view showing a first substrate according to another exemplary embodiment of the present invention, and FIG. 25 is a cross-sectional view showing J-J' line of FIG. 24.

Referring now in specific detail to FIGS. 24 and 25 in which the same reference numerals denote the same elements in FIGS. 14 to 23, and thus any further detailed descriptions concerning the same elements will be omitted.

Referring to FIGS. 24 and 25, an indium tin oxide layer is deposited over a second insulating layer 215. A portion of the indium tin oxide layer is etched to form a second electrode part 216c and a pixel electrode 218a. The second electrode part 216c is electrically connected to a first region 212a through a first contact hole 215a, and the pixel electrode 218a is electrically connected to a second region 212b through a second contact hole 215b.

A metal thin film is formed over a transparent substrate 211 having the second electrode part 216c and the pixel electrode 218a. The metal thin film is patterned to form a second signal line 216d. A portion of the second signal line 216d is disposed on the second electrode part 216c.

In general, an etchant for etching a metal thin film may substantially not etch indium tin oxide layer.

A common electrode 222 is formed over a second transparent substrate 221 to form a second substrate 220. Preferably, a color filter 223 is disposed between the second transparent substrate 221 and the common electrode 222.

A liquid crystal layer 230 is formed between the first substrate 210 and the second substrate 220 to form the display apparatus 200.

Therefore, the second electrode part 216c is formed together with the pixel electrode 218a, and a protecting layer may be omitted to simplify manufacturing process.

Figure 26:
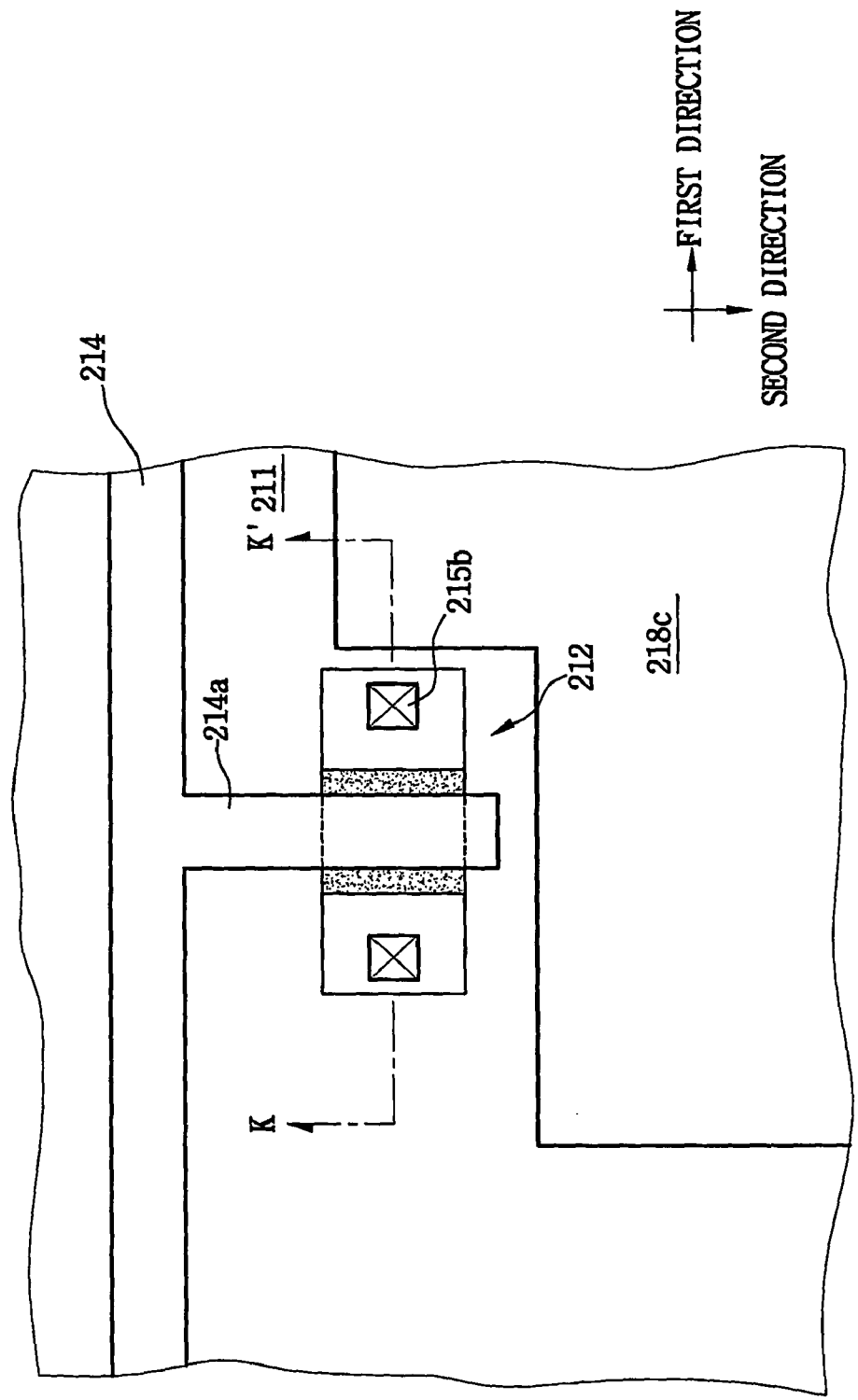
FIG. 26 is a plan view showing a first substrate according to another exemplary embodiment of the present invention.
Figure 27:
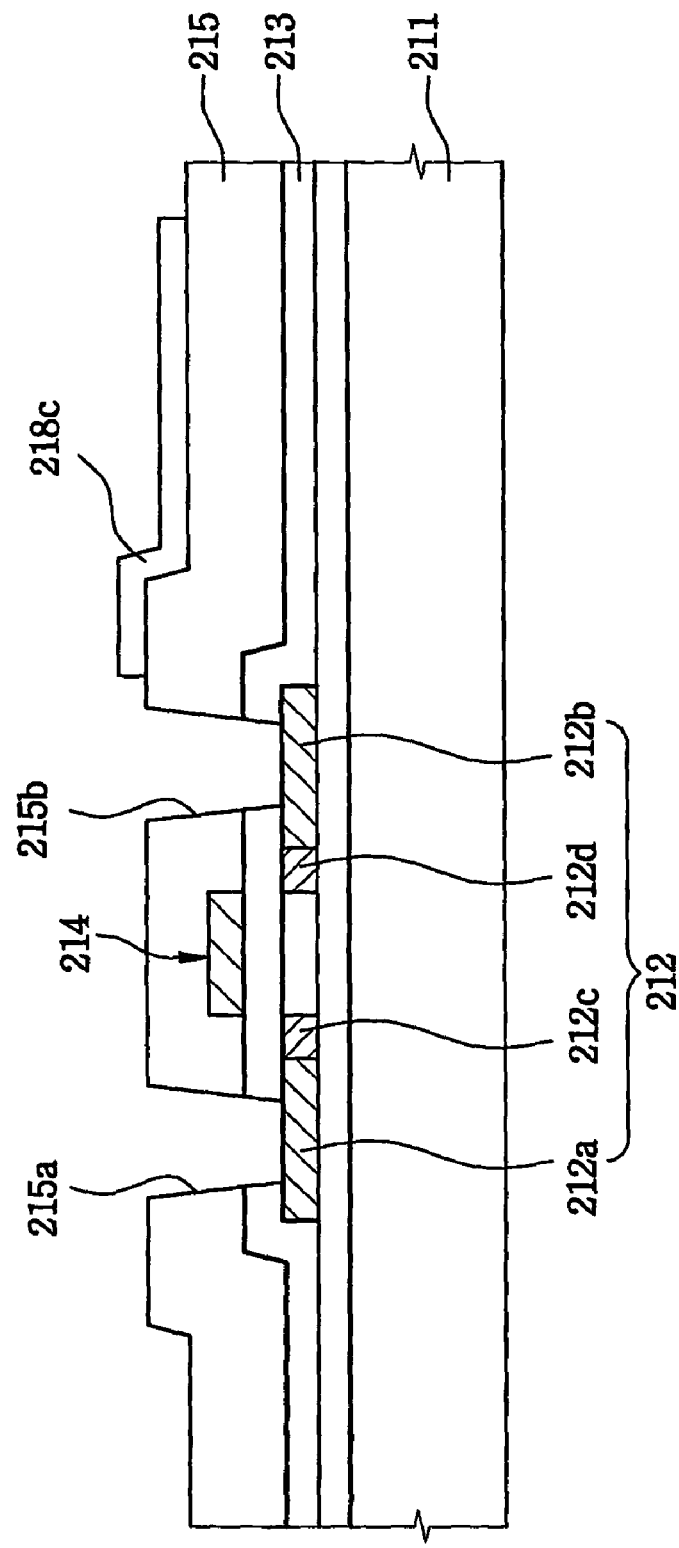
FIG. 27 is a cross-sectional view showing K-K' line of FIG. 26.

FIG. 26 is a plan view showing a first substrate according to another exemplary embodiment of the present invention, and FIG. 27 is a cross-sectional view showing K-K' line of FIG. 26.

Referring now in specific detail to FIGS. 26 and 27 in which the same reference numerals denote the same elements in FIGS. 14 to 23, and thus any further detailed descriptions concerning the same elements will be omitted.

Referring to FIGS. 26 and 27, a pixel electrode 218c is formed on a second insulating layer 215 having a first contact hole 215a and a second contact hole 215b. The pixel electrode 218c is separated from the first and second contact holes 215a and 215b.

A metal thin film is deposited on the second insulating layer 215 having the pixel electrode 218c thereon. The metal thin film is etched by using an etchant.

Preferably, the etchant may not substantially etch an indium tin oxide of the pixel electrode 218c.

Figure 28:
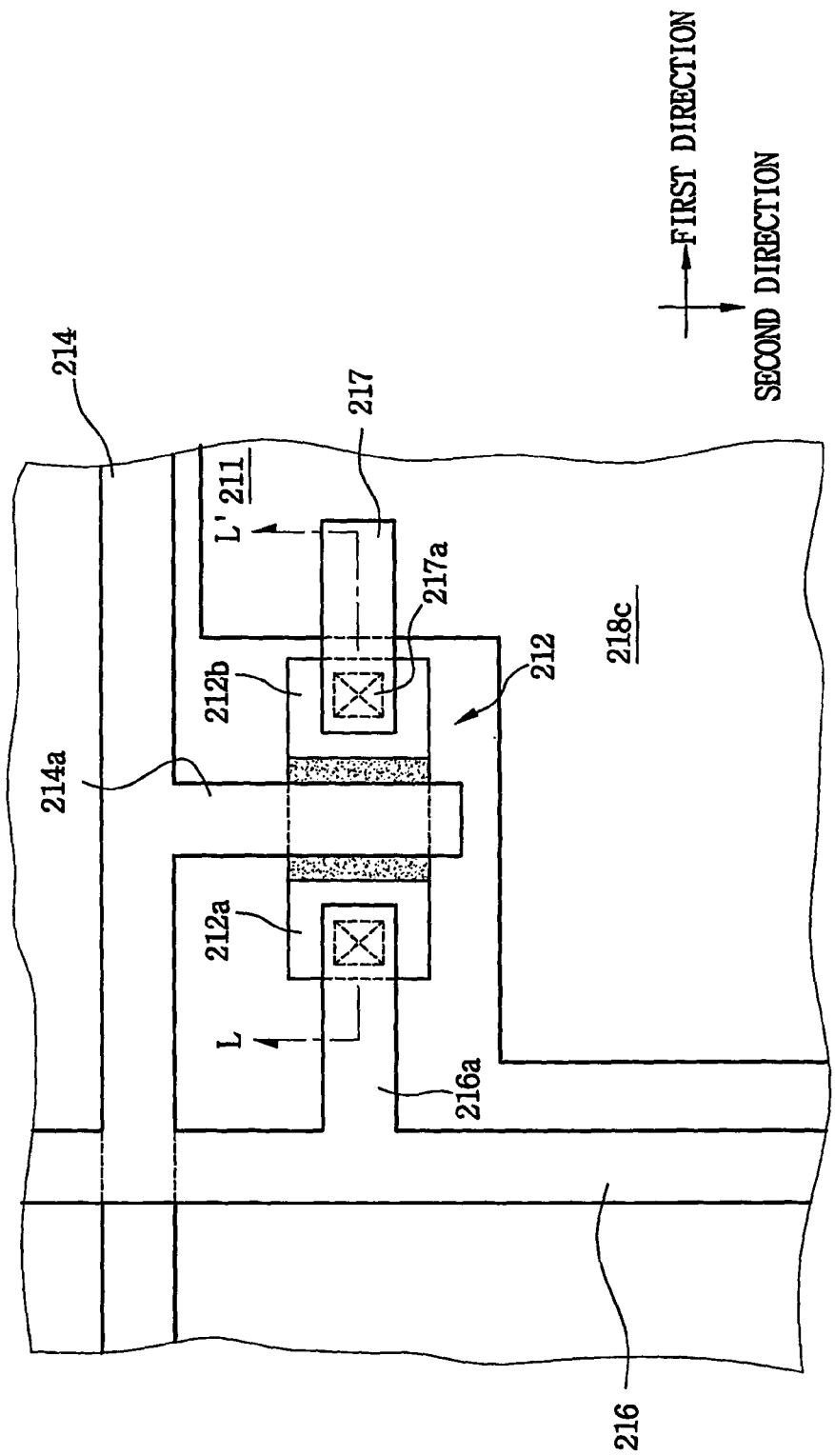
FIG. 28 is a plan view showing a first substrate according to another exemplary embodiment of the present invention.
Figure 29:
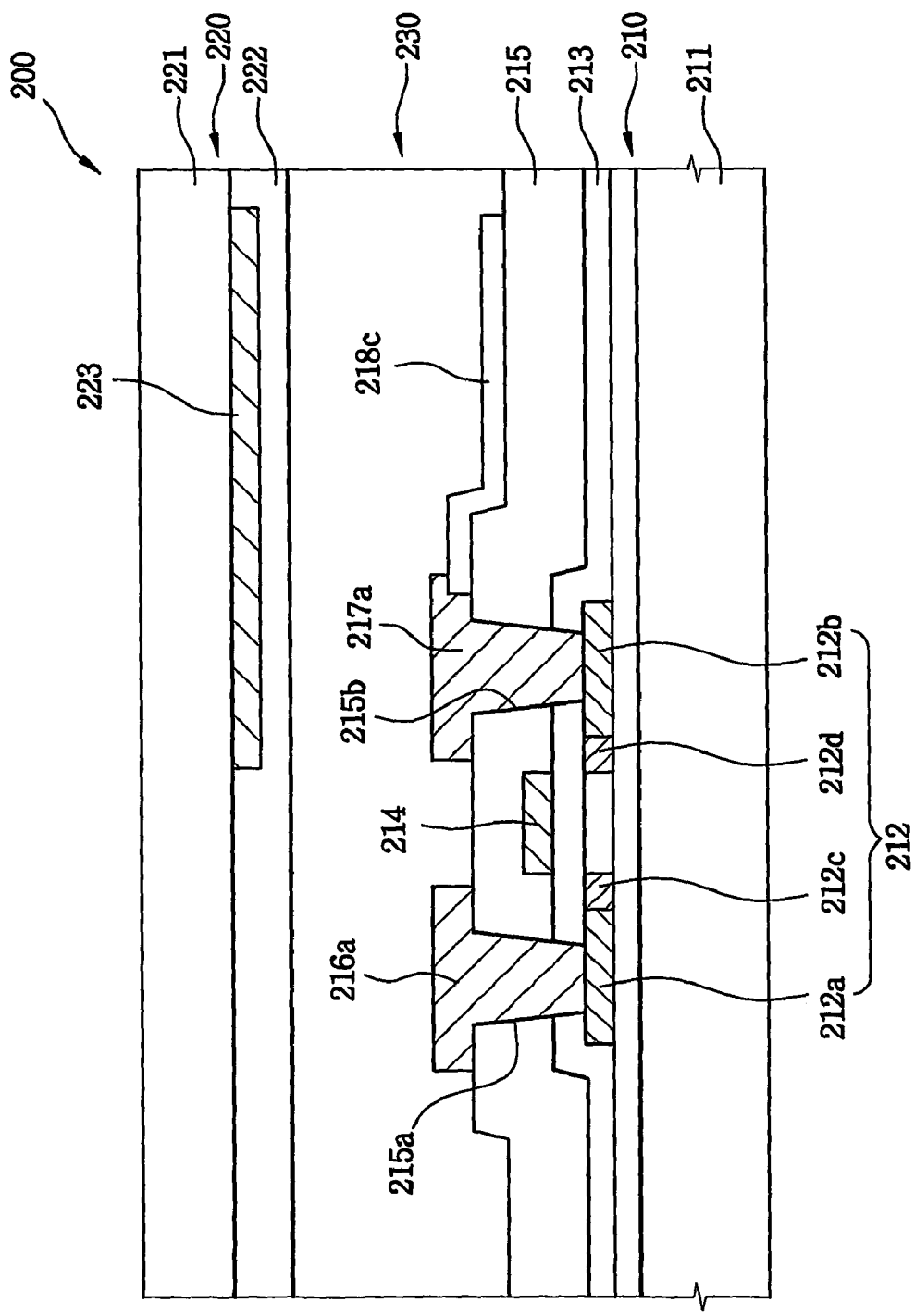
FIG. 29 is a cross-sectional view showing L-L' line of FIG. 28.

FIG. 28 is a plan view showing a first substrate according to another exemplary embodiment of the present invention, and FIG. 29 is a cross-sectional view showing L-L' line of FIG. 28.

The metal thin film is patterned to form a second signal line 216 having a second electrode 216a and a third signal line 217 having a third electrode 217a. The second electrode 216a is connected to the second signal line 216, and electrically connected to a first region 212a through the first contact hole 215a. The third electrode 217a is connected to the pixel electrode 218c, and electrically connected to a second region 212b through the second contact hole 215b.

A common electrode 222 is formed over the second transparent substrate 221 to form a second substrate 220. Preferably, a color filter 223 is disposed between the second transparent substrate 221 and the common electrode 222.

A liquid crystal layer 230 is disposed between the first substrate 210 and the second substrate 220 to form the display apparatus 200.

Therefore, the pixel electrode 218c is formed prior to the formation of the second and third electrodes 216a and 217a, and a protecting layer is omitted, thereby simplifying manufacturing process.

INDUSTRIAL APPLICABILITY

As mentioned above, structure of a display pixel for an LCD apparatus and manufacturing process are simplified to reduce manufacturing cost and time.

Also, an indium zinc oxide layer is used as a pixel electrode so that a protecting layer may be omitted, because the indium zinc oxide layer may not etch or corrode metal layers.

In addition, an indium tin oxide layer or the indium zinc oxide layer is used as the protecting layer so as to simplify manufacturing process.

Furthermore, a second electrode part is formed together with the pixel electrode so as to simplify manufacturing process.

Although the exemplary embodiments of the present invention have been described, it is understood that the present invention should not be limited to these exemplary embodiments but various changes and modifications can be made by one ordinary skilled in the art within the scope of the present invention as hereinafter claimed.

The invention claimed is:

1. A pixel for displays comprising:
a channel layer including a channel formed by applying a first voltage;
a first signal line applying the first voltage to the channel layer;
a first insulating layer disposed on the channel layer to insulate the first signal line from the channel layer and including a first contact hole and a second contact hole extending to the channel layer;
a second insulating layer disposed on the first signal line including a third contact hole that connects to the first contact hole and a fourth contact hole that connects to the second contact hole;
a second signal line disposed on an upper surface of the second insulating layer and electrically connected to the channel layer through the first and third contact holes;
a third signal line disposed on an upper surface of the second insulating layer and electrically connected to the channel layer through the second and fourth contact holes; and
a pixel electrode disposed on an upper surface of the second insulating layer and electrically connected to the third signal line.

2. The pixel of claim 1, wherein the pixel electrode comprises indium zinc oxide.

3. The pixel of claim 1, wherein the channel layer further comprises a first region and a second region implanted with impurities at a relatively higher concentration than the channel layer, and the second and third signal lines connected to the first and second regions, respectively.

4. The pixel of claim 3, wherein the channel layer further comprises a third region and a fourth region implanted with impurities at a relatively lower concentration than the channel layer, and the third and fourth regions are disposed adjacent to the first and second religions, respectively.

5. A display apparatus comprising:
a first substrate including:
a first substrate;
a channel layer formed on the first transparent substrate;
a first signal line having a first electrode insulated from the channel layer and disposed at a position corresponding to the channel layer, the first signal line being extended in a first direction;
a second signal line having a second electrode connected to the channel layer, the second signal line being extended in a second direction;
a third signal line having a third electrode connected to the channel layer and insulated from the second signal line;
a pixel electrode formed over the third signal line; and
an etch stop layer disposed over the second signal line; and
a second substrate including a second substrate corresponding to the first transparent substrate, and a common electrode formed on the second substrate.

6. The display apparatus of claim 5, wherein the first, second and third signal lines comprise a metal, and wherein the pixel electrode and the etch stop layer comprise indium tin oxide.

7. The display apparatus of claim 5, wherein the first signal line is insulated from the second and third signal lines by an insulating interlayer, and the insulating interlayer includes contact holes through which the second and third signal lines electrically connected to the channel layer.

8. An LCD apparatus comprising:
a first substrate including:
a first transparent substrate;
a channel layer formed on the first transparent substrate;
a first signal line having a first electrode insulated from the channel layer and disposed at a position corresponding to the channel layer;
a second electrode connected to the channel layer;
a second signal line disposed over the second electrode; and
a pixel electrode directly connected to the channel layer and insulated from the second electrode; and
a second substrate corresponding to the first substrate and a common electrode formed on the second substrate and corresponding to the pixel electrode.

9. The LCD apparatus of claim 8, wherein the first and second signal lines comprise a metal, and wherein the second electrode and pixel electrode comprise indium tin oxide.

10. The LCD apparatus of claim 8, wherein the first signal line is insulated from the second signal line and the pixel electrode by an insulating interlayer, and the insulating interlayer includes contact holes through which the second signal line and the pixel electrode are electrically connected to the channel layer.

11. An LCD apparatus comprising:
a first substrate including:
a first substrate; a channel layer formed on the first substrate;
a first signal line having a first electrode insulated from the channel layer and disposed at a position corresponding to the channel layer;
an insulating interlayer insulating the first signal line from the channel layer and having a plurality of contact holes;
a pixel electrode formed on the insulating interlayer;
a second signal line including a second electrode connected to the channel layer;
a third electrode connected to the channel layer and insulated from the second signal line; and
a third signal line disposed on the pixel electrode and electrically connected to the pixel electrode; and
a second substrate corresponding to the first substrate and a common electrode formed on the second substrate.

12. The LCD apparatus of claim 11, wherein the second and third signal lines comprise a metal, and wherein the pixel electrode comprises indium tin oxide.

* * * * *